(12) United States Patent
Endo et al.

(10) Patent No.: US 11,570,914 B2
(45) Date of Patent: Jan. 31, 2023

(54) ELECTRONIC DEVICE

(71) Applicant: Semiconductor Energy Laboratory Co., Ltd., Atsugi (JP)

(72) Inventors: Akio Endo, Atsugi (JP); Shigeru Onoya, Isehara (JP); Takahiro Fukutome, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 103 days.

(21) Appl. No.: 17/045,193

(22) PCT Filed: Apr. 12, 2019

(86) PCT No.: PCT/IB2019/053019
§ 371 (c)(1),
(2) Date: Oct. 5, 2020

(87) PCT Pub. No.: WO2019/207400
PCT Pub. Date: Oct. 31, 2019

(65) Prior Publication Data
US 2021/0168951 A1 Jun. 3, 2021

(30) Foreign Application Priority Data
Apr. 27, 2018 (JP) .............................. JP2018-086304

(51) Int. Cl.
*H05K 5/02* (2006.01)
*G02F 1/1333* (2006.01)
(Continued)

(52) U.S. Cl.
CPC ......... *H05K 5/0217* (2013.01); *G02F 1/1368* (2013.01); *G02F 1/133305* (2013.01);
(Continued)

(58) Field of Classification Search
CPC ............ H05K 5/0217; G02F 1/133305; G02F 1/133308; G02F 1/1368; H01L 27/1218; H01L 27/1225; H01L 29/78648
(Continued)

(56) References Cited

U.S. PATENT DOCUMENTS 7,032,984 B2  4/2006  Kim et al.
7,311,366 B2  12/2007 Kim et al.
(Continued)

FOREIGN PATENT DOCUMENTS

CN   001383503 A   12/2002
CN   102106653 A    6/2011
(Continued)

OTHER PUBLICATIONS

International Search Report (Application No. PCT/IB2019/053019) dated Jul. 16, 2019.
(Continued)

*Primary Examiner* — Ori Nadav
(74) *Attorney, Agent, or Firm* — Robinson Intellectual Property Law Office; Eric J. Robinson

(57) ABSTRACT

An electronic device including a flexible display panel is provided. The electronic device includes a display panel, a first component, a movable module, and a housing. The housing includes a first movable portion, a second component, and a third component. The third component includes a first space where the first component is stored. The display panel includes a flexible display portion. The display portion includes a first region, a second region, and a third region. The first region is fixed to the second component. The second region is fixed to the first component stored in the third component. The movable module has a function of holding a first angle that is formed between the second component and the third component by the first movable (Continued)

portion. The third region positioned between the first region and the second region has a function of forming a curved surface according to the first angle. The first component slides in the first space according to the first angle.

8 Claims, 17 Drawing Sheets

(51) Int. Cl.
*G02F 1/1368* (2006.01)
*H01L 27/12* (2006.01)
*H01L 29/786* (2006.01)
*H05K 5/00* (2006.01)
*H01L 27/32* (2006.01)
*H01L 51/00* (2006.01)

(52) U.S. Cl.
CPC .... *G02F 1/133308* (2013.01); *H01L 27/1218* (2013.01); *H01L 27/1225* (2013.01); *H01L 29/7869* (2013.01); *H01L 29/78648* (2013.01); *H01L 29/78675* (2013.01); *H05K 5/0017* (2013.01); *H01L 27/3262* (2013.01); *H01L 51/0097* (2013.01); *H01L 2251/5338* (2013.01)

(58) Field of Classification Search
USPC .......................................................... 257/43
See application file for complete search history.

(56) References Cited

U.S. PATENT DOCUMENTS

| | | |
|---|---|---|
| 9,204,565 B1 | 12/2015 | Lee et al. |
| 9,348,362 B2 | 5/2016 | Ko et al. |
| 9,572,272 B2 | 2/2017 | Lee |
| 9,844,251 B2 | 12/2017 | Lin et al. |
| 9,952,627 B2 * | 4/2018 | Aurongzeb ........... G06F 1/1641 |
| 10,631,608 B2 | 4/2020 | Lin et al. |
| 2012/0044620 A1 | 2/2012 | Song et al. |
| 2012/0264489 A1 | 10/2012 | Choi et al. |
| 2013/0314611 A1 | 11/2013 | Okutsu et al. |
| 2014/0226275 A1 | 8/2014 | Ko et al. |
| 2016/0135324 A1 | 5/2016 | Lee et al. |
| 2017/0038798 A1 | 2/2017 | Lee |
| 2017/0315588 A1 | 11/2017 | Aurongzeb et al. |

FOREIGN PATENT DOCUMENTS

| | | |
|---|---|---|
| CN | 102777845 A | 11/2012 |
| CN | 103914273 A | 7/2014 |
| CN | 103985315 A | 8/2014 |
| CN | 104200753 A | 12/2014 |
| CN | 104900149 A | 9/2015 |
| CN | 105590558 A | 5/2016 |
| CN | 106205384 A | 12/2016 |
| CN | 106444974 A | 2/2017 |
| EP | 2421231 A | 2/2012 |
| EP | 2765479 A | 8/2014 |
| JP | 2013-243588 A | 12/2013 |
| JP | 2014-161009 A | 9/2014 |
| JP | 2015-108676 A | 6/2015 |
| JP | 2018-059983 A | 4/2018 |
| KR | 2012-0016873 A | 2/2012 |
| KR | 2012-0117140 A | 10/2012 |
| KR | 2014-0101274 A | 8/2014 |
| KR | 2014-0101295 A | 8/2014 |
| KR | 2016-0056445 A | 5/2016 |
| KR | 2017-0018151 A | 2/2017 |
| WO | WO-2002/017051 | 2/2002 |

OTHER PUBLICATIONS

Written Opinion (Application No. PCT/IB2019/053019) dated Jul. 16, 2019.

Chinese Office Action (Application No. 201980028054.X), dated Jul. 4, 2022.

* cited by examiner

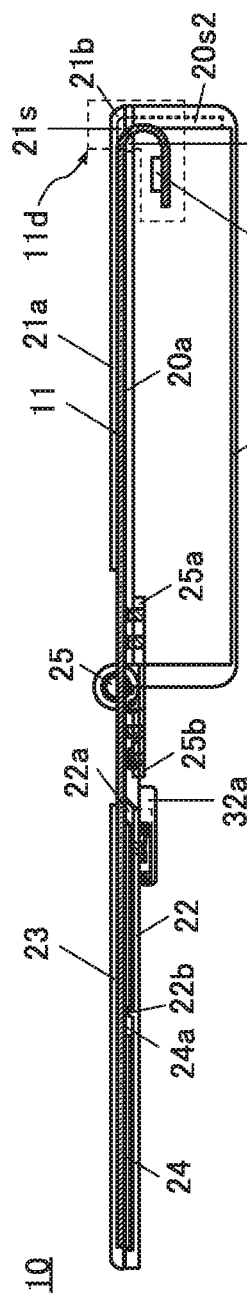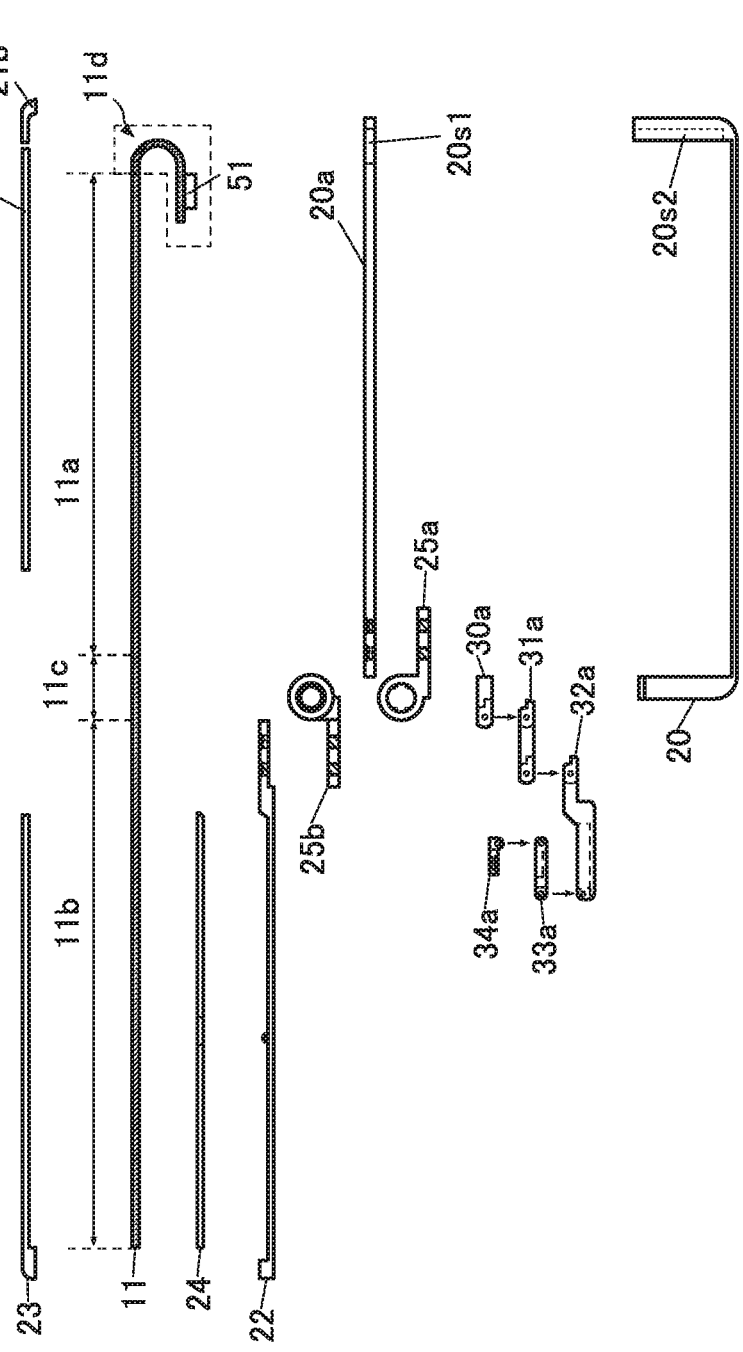
FIG. 2B
FIG. 2B

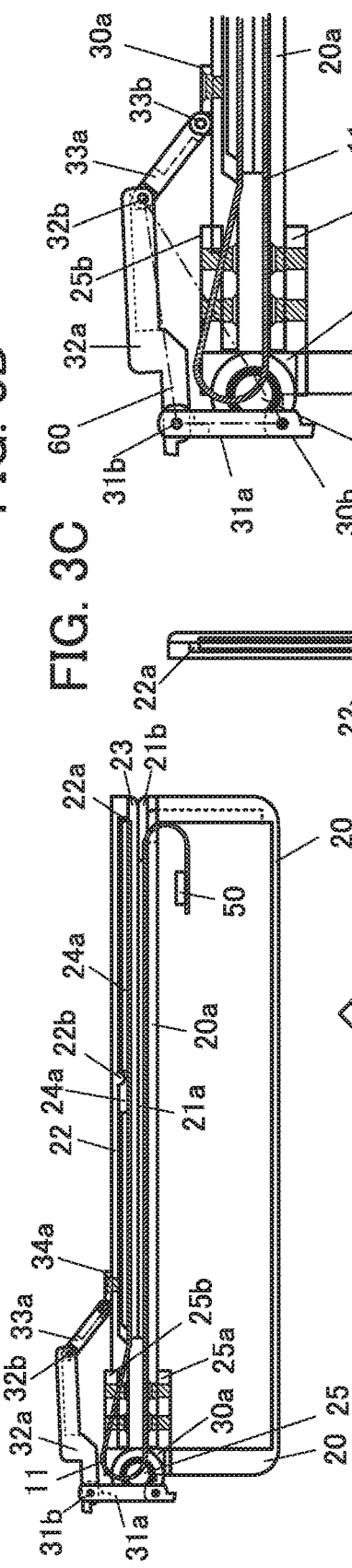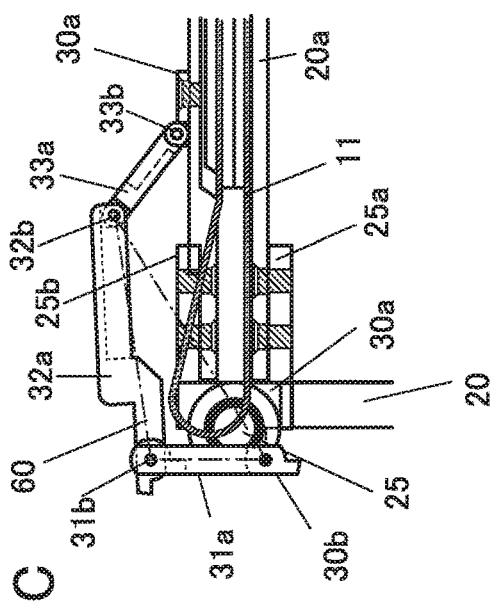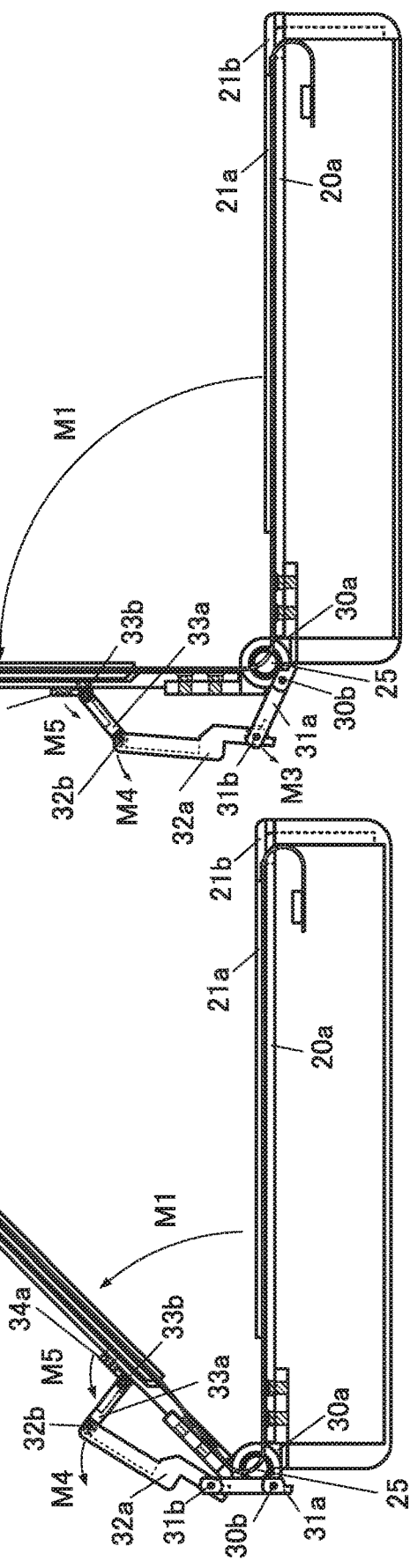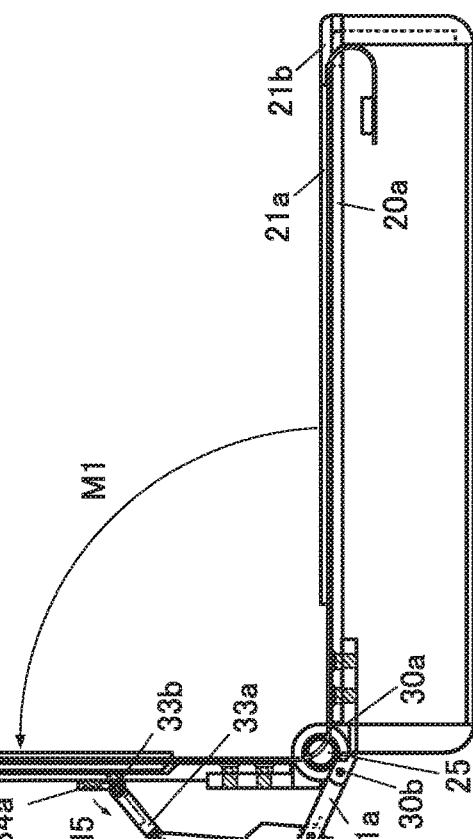

FIG. 7A
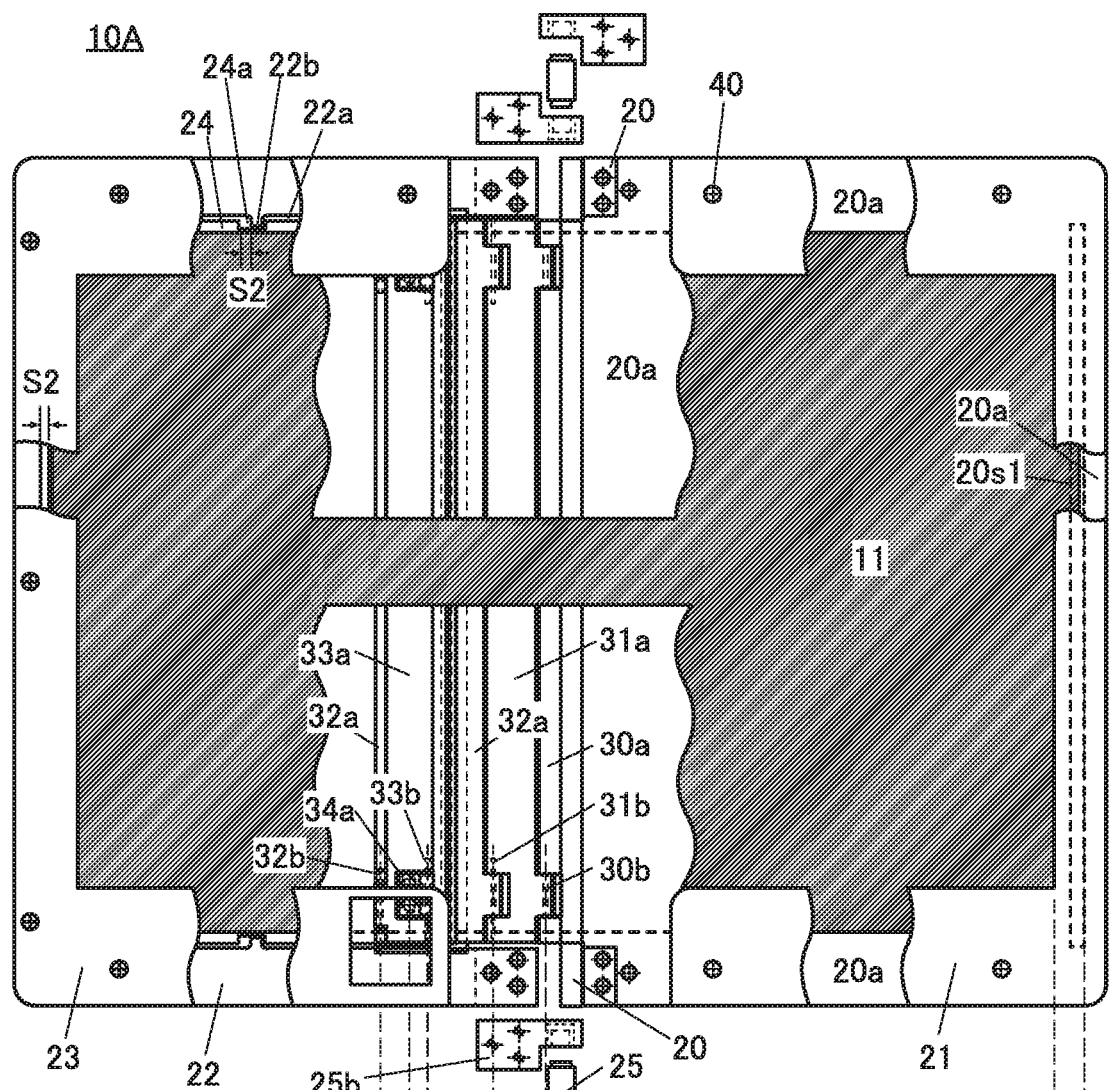
FIG. 7B
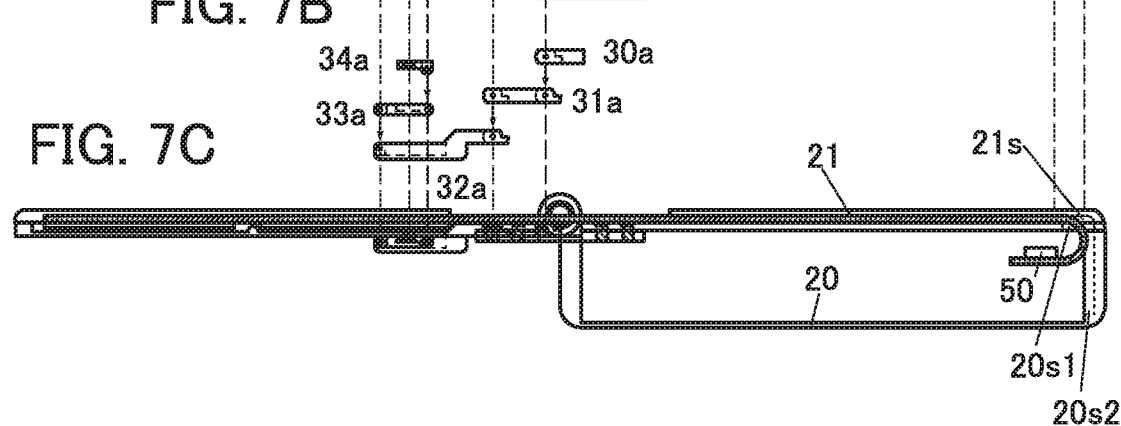
FIG. 7C

FIG. 8A
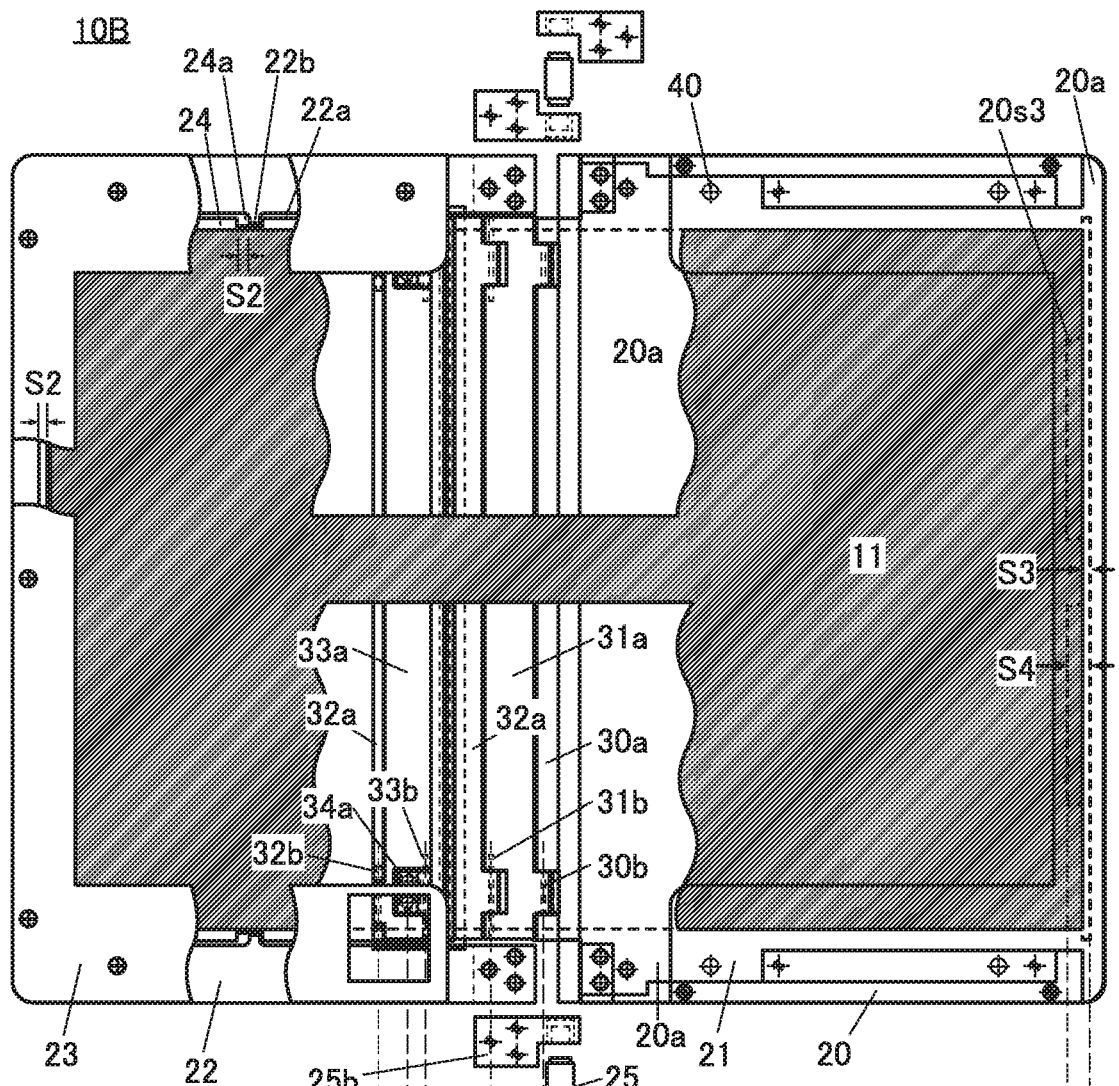
FIG. 8B
FIG. 8C
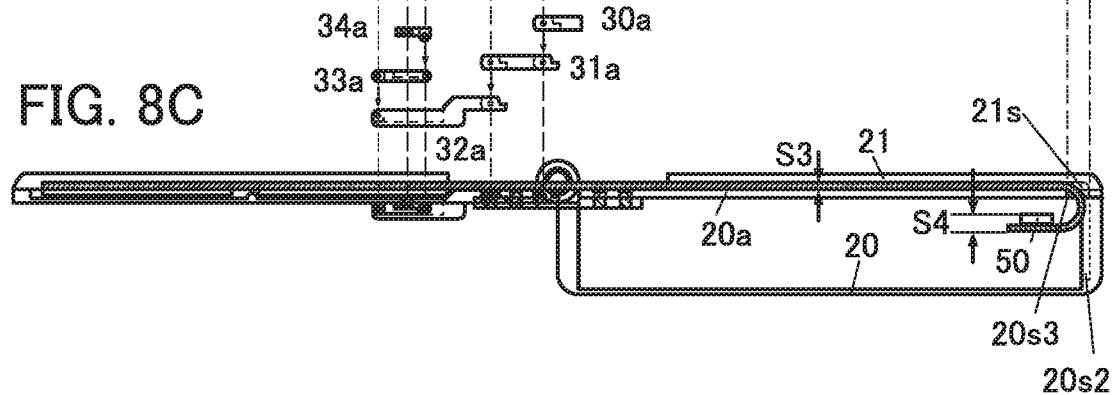

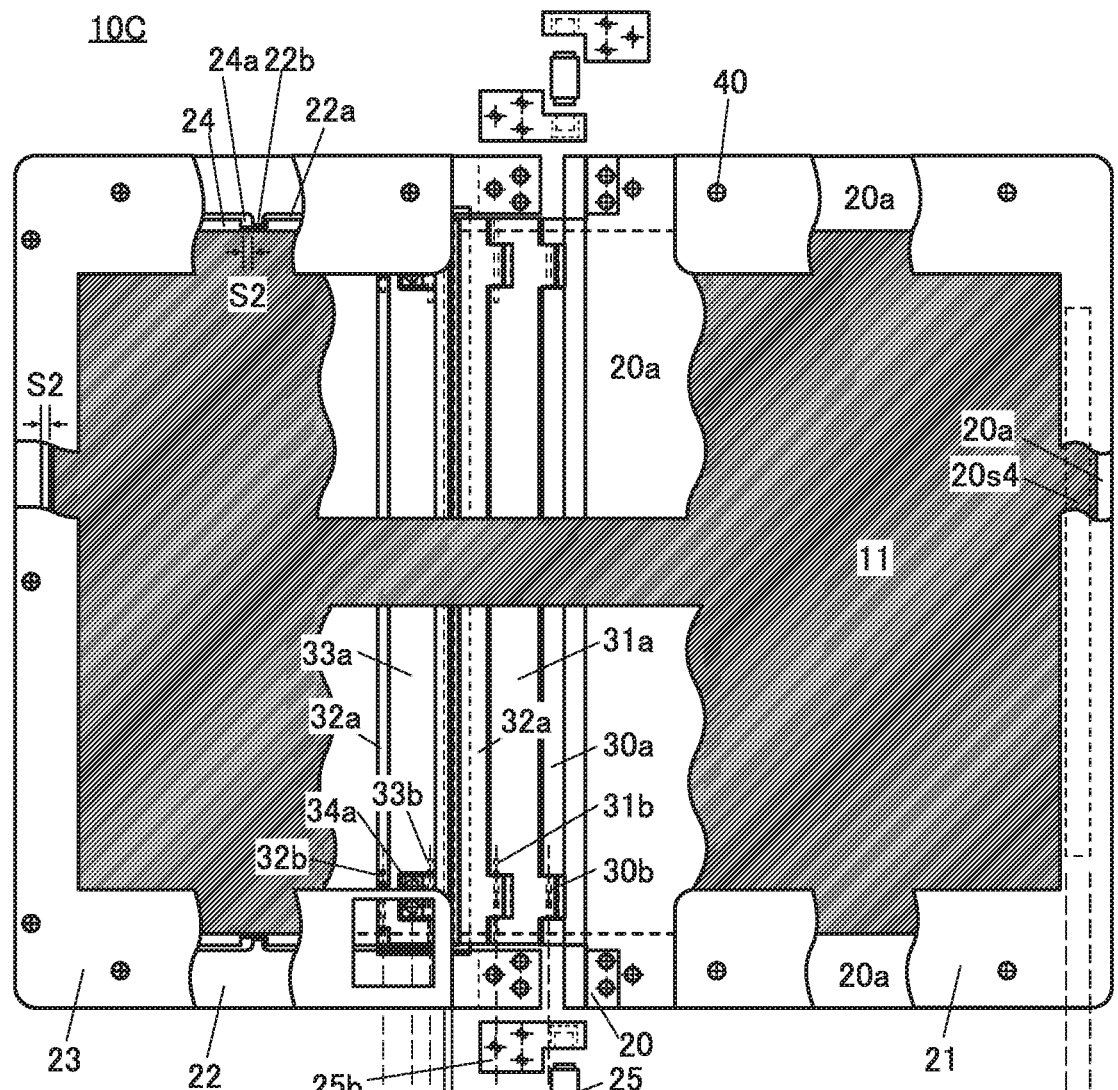
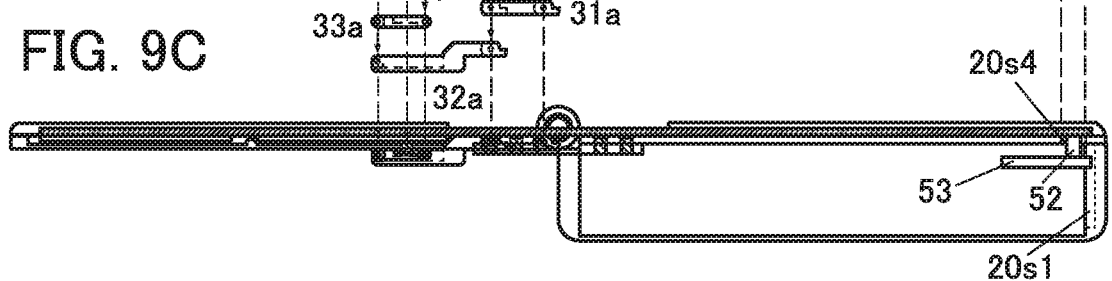

400

400LC

400EL

ELECTRONIC DEVICE

TECHNICAL FIELD

One embodiment of the present invention relates to an electronic device including a flexible display panel.

Note that one embodiment of the present invention is not limited to the above technical field. The technical field of one embodiment of the invention disclosed in this specification and the like relates to an object, a method, or a manufacturing method. Alternatively, the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

Note that in this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

Mobile devices such as smartphones, tablets, electronic book readers, and notebook personal computers have been widely used. The mobile devices require a display panel that is suitable for displaying a larger amount of information. The amount of information displayed on a display panel with the same display area has increased with a reduction in the size of a pixel. In contrast, the mobile devices are also required to have flexibility as mobile devices and to have a larger display area.

A foldable electronic device has been proposed as a mode of a mobile device that achieves both flexibility and a large screen. As the foldable electronic device, an electronic device including two or more display panels or an electronic device using a flexible display panel has been proposed.

For example, Patent Document 1 discloses a structure of an electronic device using a flexible display.

REFERENCE

Patent Document

[Patent Document 1] Japanese Published Patent Application No. 2013-243588

SUMMARY OF THE INVENTION

Problems to be Solved by the Invention

A foldable electronic device including a flexible display panel has been proposed as a method of displaying a large amount of information and increasing the screen size in a mobile device. However, the flexible display panel has a problem of being shifted in position when folded as compared with the case where the display panel is held as a flat surface.

The flexible display panel also has a problem in that a wiring or the like of the display panel disconnects when great force is applied to a curved portion of the display panel.

In the case where the display area of the display panel is increased, the display panel has a problem of slipping off from the electronic device because of having flexibility when force is applied externally.

In view of the above problems, an object of one embodiment of the present invention is to provide an electronic device with a novel structure. Another object of one embodiment of the present invention is to provide a flexible display panel having a controllable radius of curvature. Another object of one embodiment of the present invention is to provide an electronic device including a flexible display panel that is prevented from slipping off from the electronic device.

Note that the description of these objects does not preclude the existence of other objects. One embodiment of the present invention does not have to achieve all these objects. Note that other objects are apparent from and can be derived from the description of the specification, the drawings, the claims, and the like.

Note that the objects of embodiments of the present invention are not limited to the objects listed above. The objects listed above do not disturb the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and/or the other objects.

Means for Solving the Problems

One embodiment of the present invention is an electronic device including a display panel, a first component, a movable module, and a housing. The housing includes a first movable portion, a second component, and a third component. The third component includes a first space where the first component is stored. The display panel includes a flexible display portion. The display portion includes a first region, a second region, and a third region. The first region is fixed to the second component. The second region is fixed to the first component stored in the first space. The first movable portion connects the second component and the third component. The movable module has a function of holding a first angle that is formed between the second component and the third component by the first movable portion. The third region positioned between the first region and the second region has a function of forming a curved surface according to the first angle. In the electronic device, the first component slides in the first space according to the first angle.

In the above structure, the movable module includes a fourth component, a fifth component, a sixth component, a seventh component, an eighth component, a second movable portion, a third movable portion, a fourth movable portion, and a fifth movable portion. The fourth component is connected to the first movable portion and the fifth component. The fifth component is connected to the sixth component. The sixth component is connected to the seventh component. The seventh component is connected to the eighth component. The second movable portion controls a second angle formed by the fourth component and the fifth component. The third movable portion controls a third angle formed by the fifth component and the sixth component. The fourth movable portion controls a fourth angle formed by the sixth component and the seventh component. The fifth movable portion controls a fifth angle formed by the seventh component and the eighth component. The sixth component includes a second space where the seventh component is stored. The seventh component includes a third space where the eighth component is stored. In the electronic device, preferably, the eighth component is fixed to the third component and fixed to a surface of the third component that is different from a surface where the first space is provided.

In the above structure, the third component includes a structure body with a shape that projects toward the first space. The first component includes a notch region. The notch region is arranged so that the structure body with a projecting shape is positioned in the notch region. In the electronic device, preferably, the size of the notch region is the movable range of the first component that slides in the first space.

In the above structure, the housing further includes a ninth component. The display panel includes a fourth region where an electronic component is mounted. The second component includes an opening so that the fourth region is stored in a fifth space formed by the second component and the ninth component. In the electronic device, preferably, the opening has a first width and a second width, the first width is greater than the thickness of the display portion so that the display portion can pass through the first width, and the second width is greater than the thickness of a portion of the display portion where the electronic component is mounted so that the portion can pass through the second width.

In the electronic device with any of the above structures, in the case where the seventh component is not stored in the second space in the sixth component and the eighth component is not stored in the third space in the seventh component, preferably, a fourth space is formed by the fifth component, the sixth component, and the seventh component and part of the display panel is positioned in the fourth space.

In the electronic device with any of the above structures, in the case where the seventh component is stored in the second space in the sixth component and the eighth component is stored in the third space in the seventh component, preferably, part of each of the fourth component, the fifth component, and the sixth component is positioned parallel to the display panel and is in contact with the display panel.

In the electronic device with any of the above structures, preferably, the display panel includes a transistor and the transistor includes polycrystalline silicon in a semiconductor layer.

In the electronic device with any of the above structures, preferably, the display panel includes a transistor and the transistor includes a metal oxide in a semiconductor layer.

In the electronic device with each of the above structures, preferably, the display panel includes a transistor and the transistor includes a back gate.

Effect of the Invention

One embodiment of the present invention can provide an electronic device with a novel structure. Another embodiment of the present invention can provide a flexible display panel having a controllable radius of curvature. Another embodiment of the present invention can provide an electronic device including a flexible display panel that is prevented from slipping off from the electronic device.

Note that the effects of one embodiment of the present invention are not limited to the effects listed above. The effects listed above do not disturb the existence of other effects. Note that the other effects are effects that are not described in this section and will be described below. The other effects that are not described in this section will be derived from the descriptions of the specification, the drawings, and the like and can be extracted from these descriptions by those skilled in the art. Note that one embodiment of the present invention is to have at least one effect of the effects listed above and/or the other effects. Therefore, one embodiment of the present invention does not have the effects listed above in some cases.

BRIEF DESCRIPTION OF THE DRAWINGS

FIGS. 2(A) and 2(B) are a cross-sectional view and a development view illustrating an electronic device.

FIGS. 3(A) to 3(D) are cross-sectional views illustrating an electronic device.

FIGS. 7(A) to 7(C) are a top view and development views illustrating an electronic device.

FIGS. 8(A) to 8(C) are a top view and development views illustrating an electronic device.

FIGS. 9(A) to 9(C) are a top view and development views illustrating an electronic device.

MODE FOR CARRYING OUT THE INVENTION

Figure 1A:
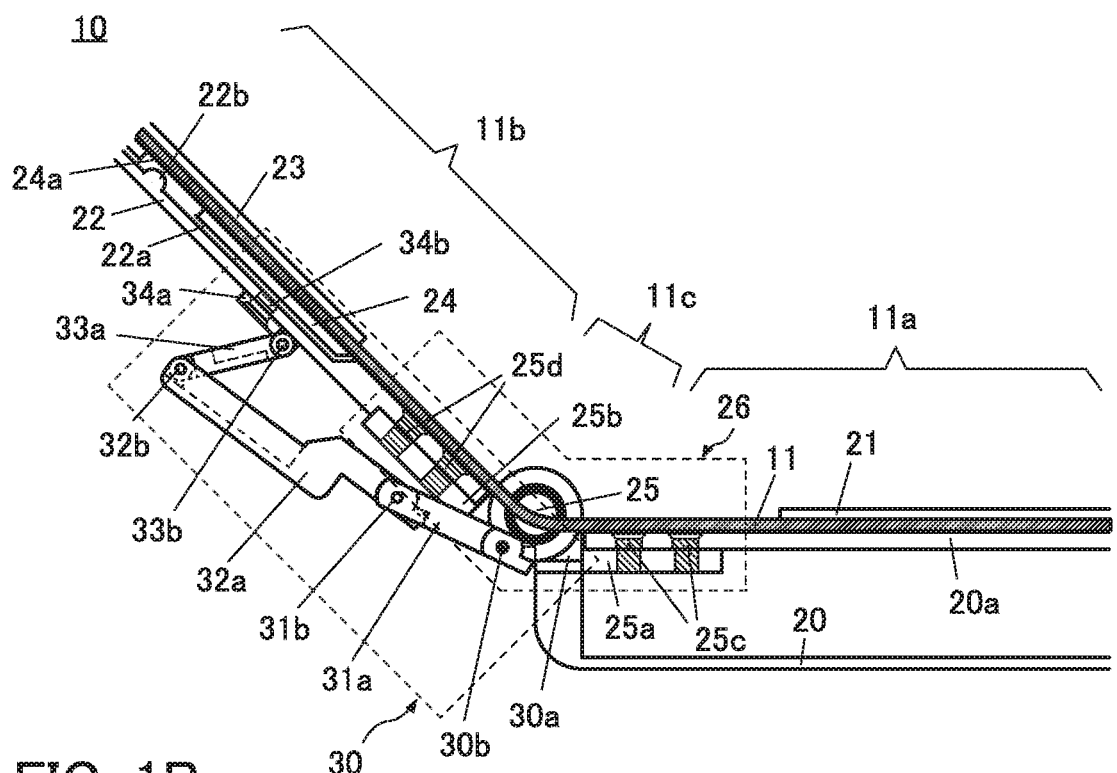
FIGS. 1(A) and 1(B) are a cross-sectional view and a development view illustrating an electronic device.

Hereinafter, embodiments will be described with reference to the drawings. Note that the embodiments can be implemented with many different modes, and it is readily understood by those skilled in the art that modes and details thereof can be changed in various ways without departing from the spirit and scope the present invention. Thus, the present invention should not be interpreted as being limited to the following descriptions of the embodiments.

In the drawings, the size, the layer thickness, or the region is exaggerated for clarity in some cases. Thus, they are not always limited to the illustrated scale. Note that the drawings are schematic views illustrating ideal examples, and embodiments of the present invention are not limited to shapes or values shown in the drawings.

Note that the ordinal numbers used in this specification, such as "first", "second", and "third", are used in order to avoid confusion among components, and the terms do not limit the components numerically.

Also in this specification, the terms for explaining arrangement, such as "over" and "under", are used for convenience to describe the positional relation between components with reference to drawings. The positional relation between components is changed as appropriate in accordance with a direction in which each component is described. Thus, the positional relation is not limited to that described with a term used in this specification and can be explained with the other terms as appropriate depending on the situation.

In this specification and the like, a transistor is an element having at least three terminals, a gate, a drain, and a source. The transistor has a channel region between the drain (a drain terminal, a drain region, or a drain electrode) and the source (a source terminal, a source region, or a source electrode), and can make current flow between the source and the drain through the channel formation region. Note that in this specification and the like, a channel region refers to a region through which current mainly flows.

The functions of a source and a drain might be switched when a transistor of opposite polarity is employed or a direction of current flow is changed in circuit operation, for example. Therefore, the terms "source" and "drain" can be switched in this specification and the like.

In this specification and the like, "electrically connected" includes the case where components are connected through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Moreover, "perpendicular" indicates a state where two straight lines are placed at an angle greater than or equal to 80° and less than or equal to 100°. Accordingly, the case where the angle is greater than or equal to 85° and less than or equal to 95° is also included.

In this specification and the like, the term "film" and the term "layer" can be interchanged with each other. For example, the term "conductive layer" can be changed into the term "conductive film" in some cases. Also, the term "insulating film" can be changed into, for example, the term "insulating layer" in some cases.

Embodiment 1

In this embodiment, an electronic device including a flexible display panel will be described with reference to FIG. 1 to FIG. 9.

The electronic device includes a flexible display panel, a first component, a movable module, and a foldable housing. The foldable housing includes a first movable portion, a second component, and a third component. In the following description, the first movable portion, the second component, and the third component are collectively referred to as a housing for simplicity unless otherwise specified. Note that the first movable portion connects the second component and the third component and can further control the angle formed by the second component and the third component. For example, a hinge or the like is preferably used as the first movable portion.

The housing can hold at least a first state or a second state. For example, in the first state, the housing is folded and two different display regions of the display panel are in contact with each other or display directions of display portions of the display panel face each other. In the second state, the housing is opened to have a flat display panel and the display portions perform display in the same direction. Note that the third state of the housing is a state between the first state and the second state. That is, in the third state, part of the display portions is curved and held. Note that the third state is described in detail in FIG. 3 or FIG. 4. In the first state, i.e., in the case where the two different display regions of the display panel are in contact with each other or the display directions of the display portions of the display panel face each other, the display panel is not seen by a user. Thus, no display data is preferably displayed on the display panel.

The third component preferably includes a first space where the first component is stored.

The display panel includes a flexible display portion, which includes a first region, a second region, and a third region. The second component is fixed to the first region and the first component stored in the third component is fixed to the second region. Note that the first component is preferably capable of sliding in the first space of the third component without being fixed in that storage space. Note that the first region and the second component, or the second region and the first component are fixed to each other with an organic resin layer. The organic resin layer preferably functions as an adhesive layer.

Next, the movable module is described. The movable module can hold a first angle that is formed between the second component and the third component by the first movable portion. The third region positioned between the first region and the second region is capable of forming a curved surface according to the first angle. The position of the display panel is shifted according to the first angle by the distance where the first component slides in the first space.

The movable module includes a fourth component, a fifth component, a sixth component, a seventh component, an eighth component, a second movable portion, a third movable portion, a fourth movable portion, and a fifth movable portion. The fourth component is connected to the first movable portion and the fifth component. The fifth component is connected to the sixth component. The sixth component is connected to the seventh component. The seventh component is connected to the eighth component. The second movable portion can control a second angle that is formed between the fourth component and the fifth component. The third movable portion can control a third angle that is formed between the fifth component and the sixth component. The fourth movable portion can control a fourth angle that is formed between the sixth component and the seventh component. The fifth movable portion can control a fifth angle that is formed between the seventh component and the eighth component.

Note that the sixth component includes a second space where the seventh component is stored, and the seventh component includes a third space where the eighth component is stored. The eighth component is fixed to the third component and fixed to a surface of the third component that is different from a surface where the first space is provided. Note that the second space may be formed by providing a notch region in the sixth component. The third space may be formed by providing a notch region in the seventh component.

Furthermore, the third component preferably includes a structure body with a shape that projects toward the first space. The first component includes a notch region, which is arranged so that the structure body with a projecting shape is positioned in the notch region. That is, the size of the notch region is the movable range of the first component that slides in the first space.

The housing further includes a ninth component. The display panel includes a fourth region where an electronic component is mounted. The second component includes an opening. The opening allows the display panel in the fourth region to be stored in a fifth space formed by the second component and the ninth component. The opening preferably has a first width and a second width. The first width is preferably greater than the thickness of the display portion so that the display portion can pass through the first width. The second width is preferably greater than the thickness of a portion of the display portion where the electronic component is mounted so that the portion can pass through the second width. Note that the fifth space preferably stores a battery, a printed board on which an electronic component is mounted, or the like. An electronic component mounted on the fourth region is preferably an FPC, a driver IC, a connector, or the like. The electronic component mounted on the fourth region is preferably electrically connected to the printed board on which a plurality of electronic components are mounted. The printed board preferably has flexibility.

In the case where the display panel has flexibility, the display panel can be curved with a radius of curvature r that is limited by a material used for the display panel, the film thickness, or the like. Hence, the radius of curvature r of the display panel needs to be controlled so as not to be smaller than or equal to the minimum radius of curvature (hereinafter referred to as a radius of curvature r in some cases) with which the display panel can be curved without being broken.

First, the case where the movable module holds the first state is described. In the case where the seventh component is not stored in the second space in the sixth component and the eighth component is not stored in the third space in the seventh component, a fourth space is formed by the fifth component, the sixth component, and the seventh component. Therefore, in the first state, part of the display panel is preferably positioned in the fourth space.

In the first state, the third region of the display panel can be stored in the fourth space so that the radius of curvature of the display panel is not smaller than r. Thus, in the case where the first state is held, the third region can be controlled by the movable module so as not to have a radius of curvature smaller than r. When the third region is stored in the fourth space so that the radius of curvature of the display panel is not smaller than r, a wiring, an inorganic film, an organic film, an organic resin film, or the like of the display panel can be prevented from being broken.

Next, the case where the movable module holds the second state is described. In the case where the seventh component is stored in the second space in the sixth component and the eighth component is stored in the third space in the seventh component, the display panel is positioned parallel to part of each of the fourth component, the fifth component, and the sixth component. Alternatively, the display panel is preferably in contact with part of each of the fourth component, the fifth component, and the sixth component.

That is, part of each of the fourth component, the fifth component, and the sixth component preferably has a surface that supports the display panel. Note that another part of the sixth component, the seventh component, and the eighth component are preferably arranged on a back surface of the third component and have a surface positioned parallel to the third component. Note that the side of the third component where the first component is arranged is referred to as a surface of the third component and the side of the third component where the eighth component is fixed is referred to as a back surface of the third component.

Figure 17:
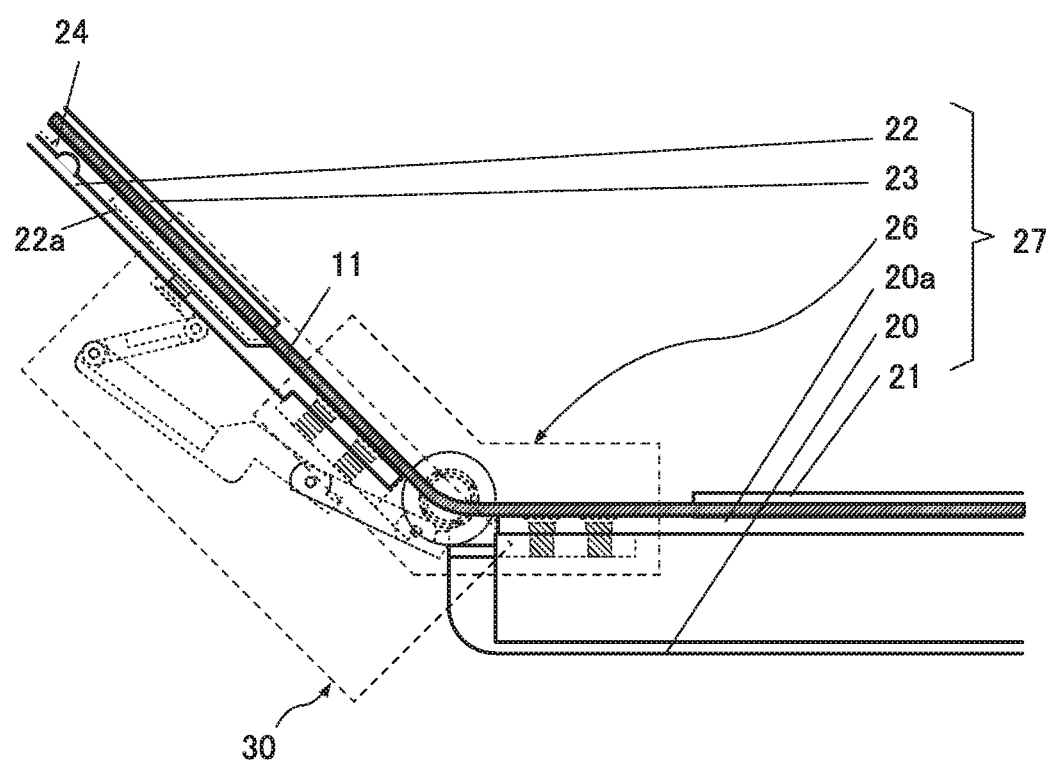
FIG. 17 is a diagram illustrating a housing.

Next, an electronic device 10 is described in detail with reference to FIG. 1 to FIG. 9. FIG. 1(A) shows a cross-sectional view of the electronic device 10 as an example. The electronic device 10 includes a display panel 11, a component 24, a movable module 30, and a housing. Note that in FIG. 17, components of the housing are denoted by solid lines. FIG. 17 is a diagram illustrating the components of the housing. A housing 27 shown in FIG. 17 includes a movable portion 26, a component 20, a component 20a, a component 21, a component 22, and a component 23.

The movable portion 26 includes a component 25, a component 25a, a component 25b, components 25c, and components 25d. The component 25a and the component 25b are rotatable around the component 25. The component 20 is fixed to the component 25a with the components 25c, and the component 22 is fixed to the component 25b with the components 25d. That is, the movable portion 26 functions as a first hinge. For example, a screw and the like can be used as the components 25c and the components 25d. Alternatively, the component 20 and the component 25a may be integrally formed. Similarly, the component 22 and the component 25b may be integrally formed.

The component 22 includes a first space 22a where the component 24 is stored. The display panel 11 includes a flexible display portion. The display portion includes a display region 11a, a display region 11b, and a display region 11c. The display region 11a is fixed to the component 20a. The display region 11b is fixed to the component 24 stored in the component 22. The component 24 is preferably capable of sliding in the first space 22a of the component 22 without being fixed in the first space 22a. The display region 11a and the component 20a, or the display region 11b and the component 24 are fixed to each other with an organic resin layer. The organic resin layer can function as an adhesive layer.

Note that the component 20a, the display panel 11, and the component 21 are preferably overlapped in this order in part of the display region 11a. The component 22, the component 24, the display panel 11, and the component 23 are preferably overlapped in this order in part of the display region 11b. That is, the component 21 and the component 23 are arranged so as to surround the display regions 11a, 11b, and 11c and function as a bezel of the display panel 11.

The movable module 30 can hold a first angle that is formed between the component 20a and the component 22 by the movable portion 26. The display region 11c positioned between the display region 11a and the display region 11b forms a curved surface according to the first angle. The position of the display panel is shifted according to the first angle by the distance where the component 24 slides in the first space 22a.

Next, a structure of the movable module 30 is described in detail with reference to a development view in FIG. 1(B). The movable module 30 includes a component 30a, a component 31a, a component 32a, a component 33a, a component 34a, a movable portion 30b, a movable portion 31b, a movable portion 32b, and a movable portion 33b.

The component 30a is connected to the movable portion 26 and the component 31a. The component 31a is connected to the component 32a. The component 32a is connected to the component 33a. The component 33a is connected to the component 34a.

The movable portion 30b controls a second angle that is formed between the component 30a and the component 31a.

The movable portion 31b controls a third angle that is formed between the component 31a and the component 32a. The movable portion 32b controls a fourth angle that is formed between the component 32a and the component 33a. The movable portion 33b controls a fifth angle that is formed between the component 33a and the component 34a.

The component 32a includes a space 32c where the component 33a is stored. The component 33a includes a space 33c where the component 34a is stored. The component 34a is fixed to the component 22 and fixed to a surface of the component 22 that is different from the surface where the space 22a is provided, with a component 34b. In the following description, for simplicity, the side of the component 22 where the component 24 is arranged is referred to as a surface of the component 22 and the side of the component 22 where the component 34a is fixed is referred to as a back surface of the component 22 in some cases. Note that the space 32c may be formed by providing a notch region in the component 32a. The space 33c may be formed by providing a notch region in the component 33a.

Furthermore, the component 22 preferably includes a structure body 22b with a shape that projects toward the first space 22a. The component 24 includes a notch region 24a, which is arranged so that the structure body 22b is positioned in the notch region 24a. The size of the notch region 24a is the movable range of the component 24 that slides in the first space 22a. Note that FIG. 5 illustrates the relation among the first angle, the notch region 24a, and the structure body 22b, and FIG. 6 illustrates details of the structure body 22b and the notch region 24a with reference to the top view of the electronic device 10.

Next, the structure of the electronic device 10 is described in detail with reference to FIG. 2. FIG. 2(A) is a cross-sectional view of the housing 27 that holds the second state. In FIG. 2(A), the display panel includes a region 11d as an example. Note that the display panel is formed in a region where the region 11d, the display region 11a, the display region 11c, and the display region 11b are connected in this order. The component 20a includes an opening 20s1 so that the region 11d is stored in a fifth space formed by the component 20a and the component 21. The display panel 11 has flexibility. Note that the display region 11c needs to be controlled so as not to be curved with a radius of curvature smaller than the minimum radius of curvature r of the display panel. Thus, the component 20 preferably includes a sixth space 20s2 where the display region of the region 11d is to be stored. In addition, a component 21a and a component 21b preferably include a seventh space 21s where the display panel 11 is stored. The display panel 11 may be provided so as to be in contact with the component 21a and the component 21b in the seventh space 21s or part of the component 21a or the component 21b may have a region that is not in contact with the display panel 11.

For example, in the case where the component 21a and the component 21b are provided so as to be in contact with the display panel 11, the display panel 11 is stably fixed by the component 21a and the component 21b. In contrast, when part of the component 21a or part of the component 21b has a region that is not in contact with the display panel 11, variations in processing of the display panel 11 can be absorbed by the seventh space 21s. For example, even in the case where the display panel in the region 11d varies in thickness, the seventh space 21s can prevent the display panel 11 from being pressed and disconnected.

The opening 20s1 preferably has a first width and a second width, which will be described in detail in FIG. 8. The first width is preferably greater than the thickness of the display portion of the display panel 11 so that the display portion can pass through the first width. The second width is preferably greater than the thickness of a portion of the region 11d where an electronic component is mounted so that the portion can pass through the second width. Although not shown in the drawings, the fifth space preferably stores a battery, a printed board on which an electronic component is mounted, or the like. An electronic component 50 mounted on the region 11d is preferably an FPC, a driver IC, a connector, or the like, and is preferably electrically connected to the printed board on which the electronic component is mounted. The printed board preferably has flexibility.

FIG. 2(B) shows a development view of components used in the electronic device 10. In FIG. 2(A), the electronic component 50 is arranged on the side of the display panel 11 that is different from the display direction; in FIG. 2(B), an electronic component 51 is arranged on the same side as the display surface of the display panel 11 unlike in FIG. 2(A). That is, a terminal portion in the region 11d may be provided on the display surface or the surface different from the display surface. Note that the arrangement is preferably determined as appropriate in accordance with the arrangement of the battery or the printed board on which the electronic component is mounted in the fifth space.

In FIG. 2(B), the width of the display region 11c is preferably greater than a distance πr. When the width of the display region 11c is greater than the distance πr, the contact between the component 21a and the component 23 can be prevented at the time when the housing 27 changes from the first state to the second state. Note that π represents pi and the radius of curvature r is a positive value excluding 0.

Next, the process where the electronic device 10 changes from the first state to the second state through the third state is described with reference to FIG. 3 and FIG. 4. First, operations of the movable portion 26 (see FIG. 1), the movable portion 30b, the movable portion 31b, the movable portion 32b, and the movable portion 33b are defined as follows. The angle formed between the component 20a and the component 22 by the movable portion 26 is denoted as a first angle M1. The angle formed between the component 30a and the component 31a by the movable portion 30b is denoted as a second angle M2. The angle formed between the component 31a and the component 32a by the movable portion 31b is denoted as a third angle M3. The angle formed between the component 32a and the component 33a by the movable portion 32b is denoted as a fourth angle M4. The angle formed between the component 33a and the component 34a by the movable portion 33b is denoted as a fifth angle M5.

First, the first state where the housing 27 of the electronic device 10 is folded is described with reference to FIG. 3(A). In FIG. 3, description is made focusing on the movable module 30. Note that FIG. 3(D) is an enlarged view of the movable module 30 in FIG. 3(A).

In the case where the housing 27 holds the first state, the component 33a is not stored in the space 32c in the component 32a and the component 34a is not stored in the space 33c in the component 33a. Note that in the case where the housing 27 holds the first state, the second angle M2 is preferably almost a right angle.

In the case where the housing 27 holds the first state, preferably, a fourth space 60 is formed by the component 31a, the component 32a, and the component 33a and part of the display panel 11 is positioned inside the fourth space 60 as shown in FIG. 3(D).

Note that in the case where the housing 27 holds the first state, the display region 11c can be stored in the fourth space 60 so that the radius of curvature of the display panel 11 is not smaller than r. Thus, in the case where the housing 27 holds the first state, the display region 11c of the display panel 11 can be controlled by the movable module 30 so as not to have a radius of curvature smaller than r. That is, when the display panel 11 is stored in the fourth space 60 so as not to be curved with a radius of curvature smaller than r, the wiring, the inorganic film, the organic film, the organic resin film, or the like of the display panel 11 can be prevented from being broken. The display region 11a is preferably fixed to the component 20a in order that the display region 11c can be stored in the fourth space 60 more efficiently. The display region 11c can be efficiently stored in the fourth space 60 when the display panel 11 is fixed to the component 20a up to the vicinity of the movable portion 26.

Next, the case where the first angle M1 is approximately 45° (including 45°) is shown in FIG. 3(B) as an example. It is preferable that in FIG. 3(B), the second angle M2 hold almost a right angle. The third angle M3 becomes larger, and the fourth angle M4 and the fifth angle M5 become smaller. The third angle M3 to the fifth angle M5 change when the second angle M2 holds almost a right angle. Note that in the case where the second angle M2 is not almost a right angle, the third angle M3 to the fifth angle M5 change in a way different from the above.

Next, the case where the first angle M1 is almost a right angle (including a right angle) is shown in FIG. 3(C) as an example. The second angle M2 in FIG. 3(C) is preferably larger than that in FIG. 3(B). The third angle M3 becomes smaller, and the fourth angle M4 and the fifth angle M5 become larger. The third angle M3 to the fifth angle M5 change when the second angle M2 is smaller than that in FIG. 3(B). Note that in the case where the second angle M2 becomes small, the third angle M3 to the fifth angle M5 change in a way different from the above.

Figure 4A:
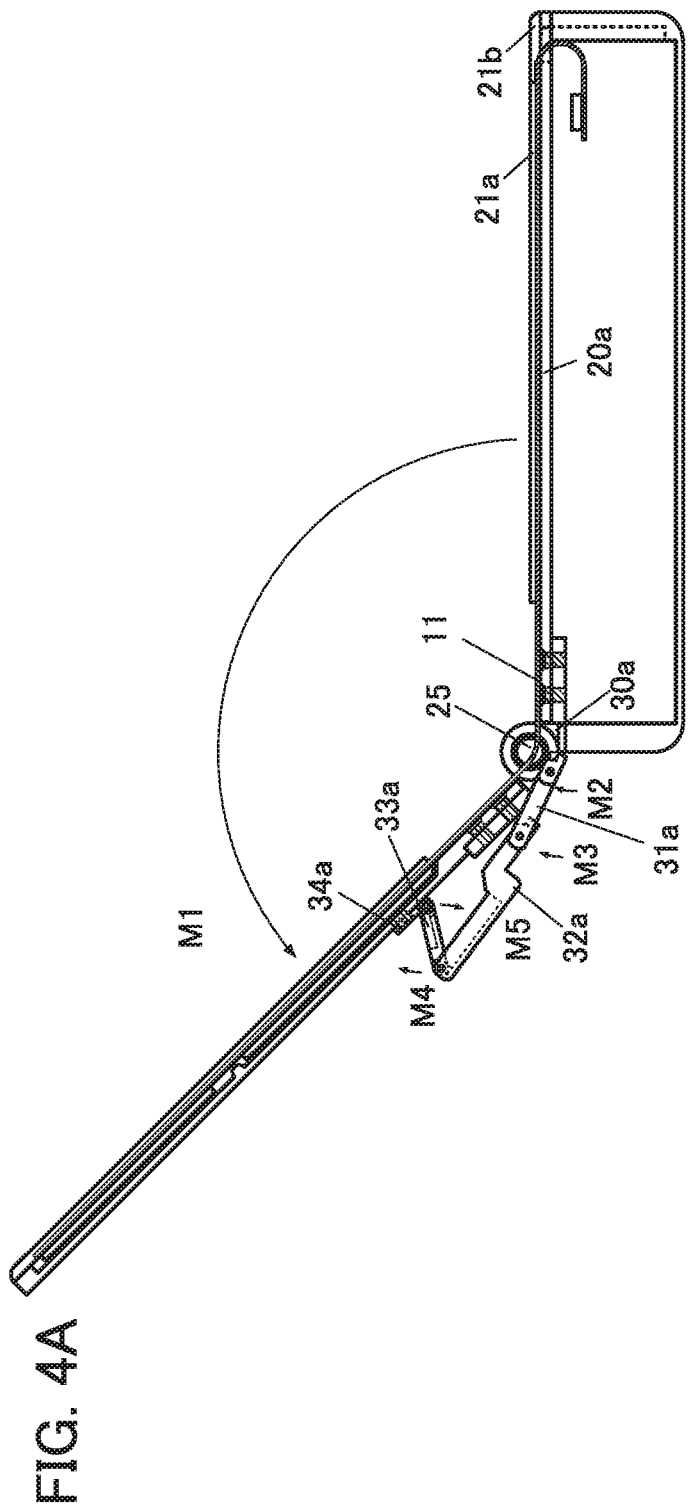
FIGS. 4(A) and 4(B) are cross-sectional views illustrating an electronic device.

Next, the case where the first angle M1 is approximately 135° (including 135°) is shown in FIG. 4(A) as an example. The second angle M2 in FIG. 4(A) is preferably still larger than that in FIG. 3(C). The third angle M3 becomes larger, and the fourth angle M4 and the fifth angle M5 become smaller. The third angle M3 to the fifth angle M5 change when the second angle M2 is larger than that in FIG. 3(C).

Figure 4B:
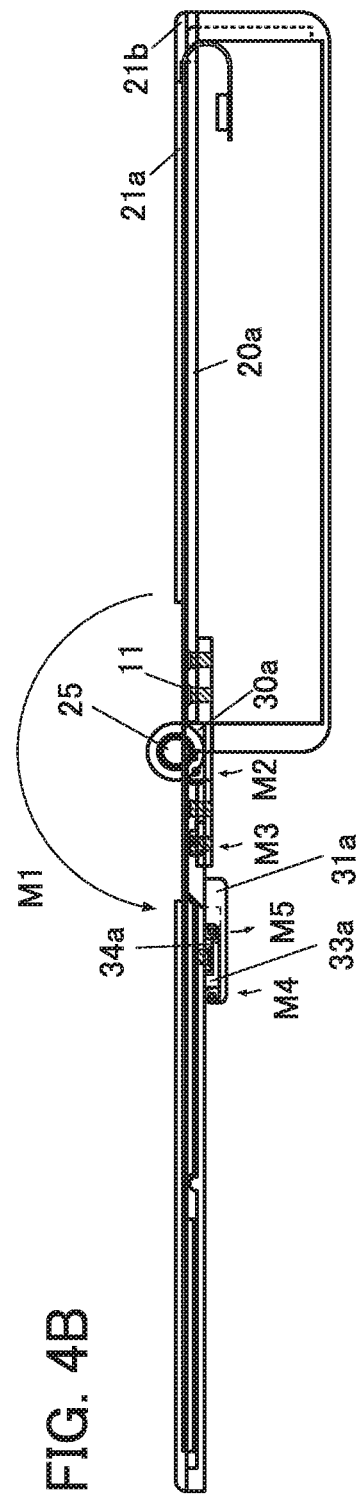

Lastly, the case where the first angle M1 is approximately 180° (including 180°) is shown in FIG. 4(B) as an example. That is, the housing 27 is changed into the second state. In FIG. 4(B), the second angle M2 is still larger than that in FIG. 4(A) and reaches the maximum angle. The maximum angle denotes approximately 180°. The third angle M3 also reaches the maximum angle. The fourth angle M4 and the fifth angle M5 become smaller to reach the minimum angle. The minimum angle denotes approximately 0° (including 0°). Thus, the component 33a is stored in the component 34a and the component 32a is stored in the component 33a. Parts of the component 30a, the component 31a, and the component 32a are in contact with the display panel 11 and can support the display panel 11. Furthermore, it is preferable that another part of the component 32a, the component 33a, or the component 34a be in contact with the back surface of the component 22 or have a surface positioned parallel to the component 22.

Note that the housing 27 is in the third state in FIG. 3(B) or 3(C) or FIG. 4(A). When the housing 27 is in the second state or the third state, display data can be displayed on the display regions 11a to 11c.

Although the first angle M1 of the housing 27 is approximately 0°, approximately 45°, approximately 90°, approximately 135°, or approximately 180° in FIG. 3 or FIG. 4, the first angle M1 is not limited to the above examples. Any one of the angles of approximately 0° to approximately 180° can be held as the first angle.

Next, the relation among the first angle M1, the notch region 24a in the component 24, and the structure body 22b with a projecting shape in the component 22 is described in FIGS. 5(A) to 5(E). Note that in FIG. 5, the movable portion 26, the structure body 22b, the notch region 24a, and the first space 22a are described. Note that in FIG. 5, description is made focusing on a position Pna, which is the closest to the movable portion 26, the position including the structure body 22b, and a position Pnb, which is the farthest from the movable portion 26 in the first space 22a. Note that n is a positive integer greater than or equal to 1.

Note that the size and the width of the component 24 are not changed. The position of the notch region 24a provided in the component 24 is not changed either. Furthermore, the position where the structure body 22b with a projecting shape is provided in the component 22 is not changed. The structure body 22b has a shape with a width 51 from the center of the structure body 22b. The structure body has a semicircular cross section in the example in the drawing, but the shape is not limited and may be a pillar or the like. The structure body 22b preferably includes a region shared by part of the component 22. For example, the structure body 22b may be simultaneously formed when the first space 22a is processed in the component 22. A reduction in the number of components can reduce component costs for an electronic device. Note that in the case where the component 24 includes the structure body with a projecting shape, the notch region may be included in the component 22.

Figure 5A:
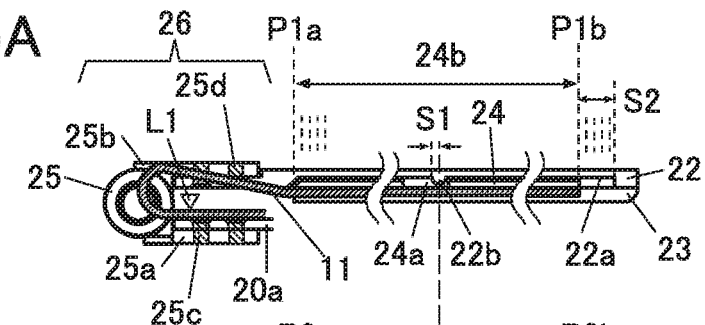
FIGS. 5(A) to 5(E) are cross-sectional views illustrating an electronic device.

FIG. 5(A) illustrates the case where the housing 27 holds the first state, i.e., the first angle M1 is approximately 0°. The component 22 includes the first space 22a where the component 24 is stored and the component 24 can slide in the first space 22a. Note that the component 24 is fixed to the display region 11b, and when the first angle M1 of the housing 27 changes, the position of the display region 11c is shifted and the display region 11b moves. That is, the display region 11b moves according to the distance of the position shift, and the component 24 slides according to the distance where the display region 11b moves. Note that the display region 11a is preferably fixed to the component 20a in the range up to a position L1. For the positional relation among the display regions 11a, 11b, and 11c, FIG. 5(E) can be referred to.

In the case where the housing 27 holds the first state, a curved surface of the display region 11c is preferably controlled so as not to have a radius of curvature smaller than the minimum radius of curvature r. For example, in the case where the display region 11a and the display region 11b are in contact with or face each other, the display region 11c forms a curved surface with a radius of curvature greater than r. Hence, part of the display region 11b is arranged apart from the display region 11a by two times the radius of curvature r (diameter) or more. That is, when the display region 11c forms a curved surface with a radius of curvature greater than or equal to r, the positions of part of the display region 11b and the display region 11c are shifted.

In the case where the housing 27 holds the first state, the distance of the position shift is the same as the distance where the component 24 stored in the first space 22a slides. Thus, the movable module 30 can control the display region 11c so as not to have a radius of curvature smaller than r. In addition, the structure body 22b with a projecting shape in the component 22 is in contact with a side surface of the notch region 24a in the component 24 that is farther from the movable portion 26, which limits the range where the component 24 can slide toward the movable portion 26. Furthermore, the position of the first space 22a is preferably determined so that the range where the component 24 can slide is limited at a position P1a that is the closest to the movable portion 26. The control of the range where the component 24 can slide allows controlling of the display panel 11 so as not to have a radius of curvature smaller than r. Note that the component 24 to which the display region 11b and the display region 11b are fixed preferably slides to the position P1a close to the movable portion 26 and a position P1b.

Figure 5B:
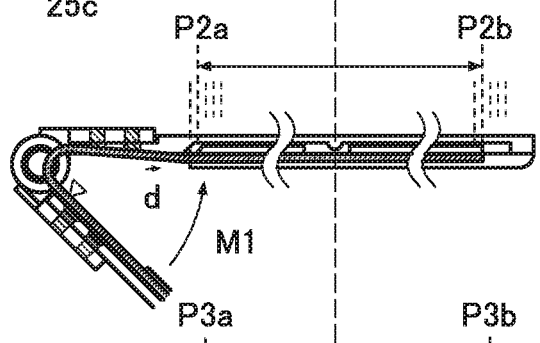

Next, the case where the first angle M1 changes from approximately 0° to approximately 45° is described in FIG. 5(B). As for the position shift generated in the display panel 11, the position of the display panel 11 changes according to the first angle M1. In the case where the first angle M1 changes from approximately 0° to approximately 45°, the display region 11b and the display region 11c slide to move a distance d. Note that the component 24 to which the display region 11b and the display region 11b are fixed slides from the position P1a to a position P2a in a position close to the movable portion 26 and slides from the position P1b to a position P2b in a position far from the movable portion 26.

Figure 5C:
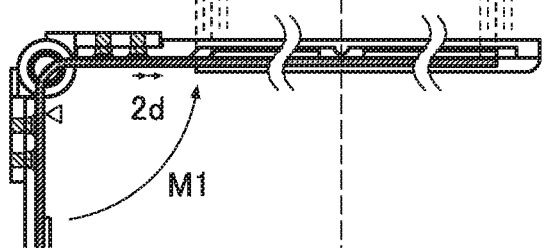

Next, the case where the first angle M1 changes from approximately 0° to approximately 90° is described in FIG. 5(C). In the case where the first angle M1 changes from approximately 0° to approximately 90°, the display region 11b and the display region 11c slide to move a distance 2d. Note that the component 24 to which the display region 11b and the display region 11b are fixed slides from the position P1a to a position P3a in a position close to the movable portion 26 and slides from the position P1b to a position P3b in a position far from the movable portion 26.

Figure 5D:
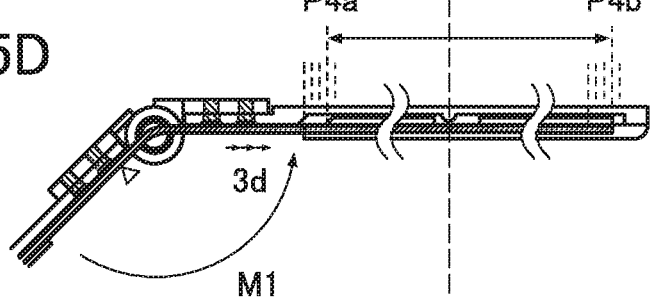

Next, the case where the first angle M1 changes from approximately 0° to approximately 135° is described in FIG. 5(D). In the case where the first angle M1 changes from approximately 0° to approximately 135°, the display region 11b and the display region 11c slide to move a distance 3d. Note that the component 24 to which the display region 11b and the display region 11b are fixed slides from the position P1a to a position P4a in a position close to the movable portion 26 and slides from the position P1b to a position P4b in a position far from the movable portion 26.

Note that in the case where the first angle M1 is greater than approximately 90° and less than approximately 180°, the position shift from the position L1 occurs in some cases. This is because the display panel 11 has flexibility and thus stress is applied in such a direction that the display panel 11 is apart from the movable portion 26 with the position L as a base point.

Figure 5E:
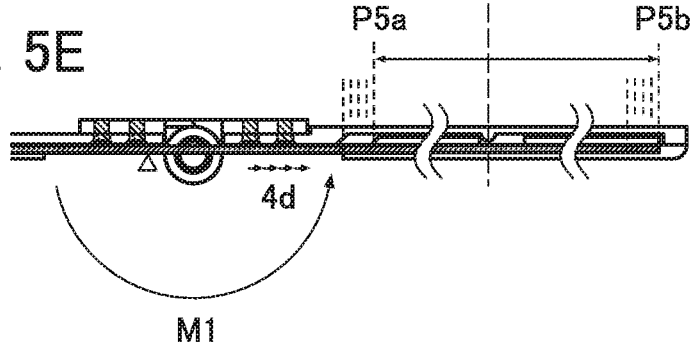

Next, the case where the first angle M1 changes from approximately 0° to approximately 180° is described in FIG. 5(E). That is, when the first angle M1 reaches approximately 180°, the housing 27 reaches the second state. In the case where the first angle M1 changes from approximately 0° to approximately 180°, the display region 11b and the display region 11c slide to move a distance 4d. Note that the display region 11b and the component 24 to which the display region 11b is fixed slide from the position P1a to a position P5a in a position close to the movable portion 26 and slide from the position P1b to a position P5b in a position far from the movable portion 26. When the first angle M1 reaches approximately 180°, the display panel 11 forms a flat surface. Thus, the position shift generated in each of FIGS. 5(A) to 5(D) all disappears.

Figure 6A:
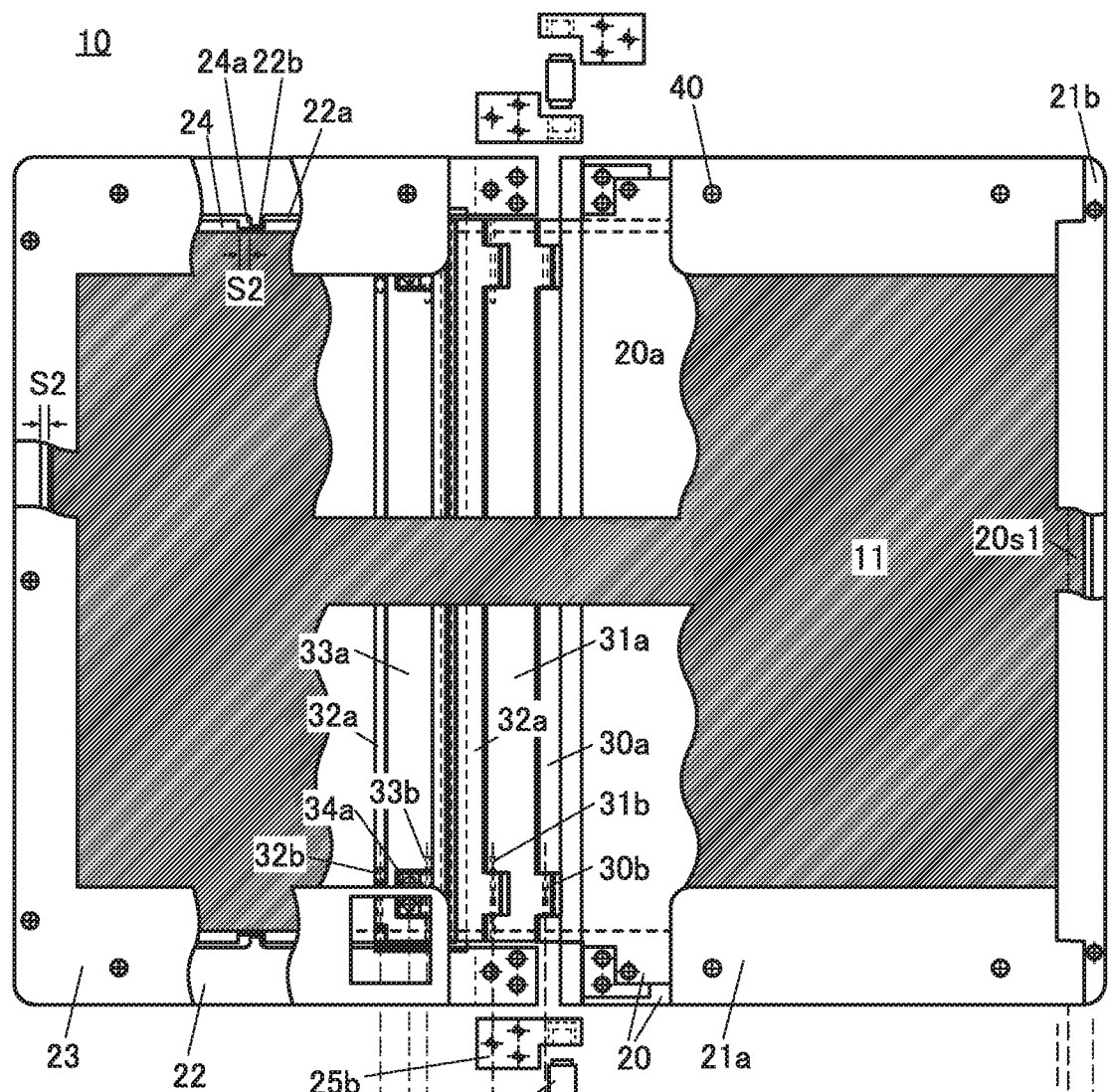
FIGS. 6(A) to 6(C) are a top view and development views illustrating an electronic device.
Figure 6B:
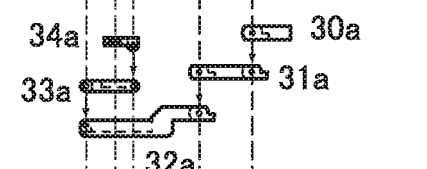
Figure 6C:
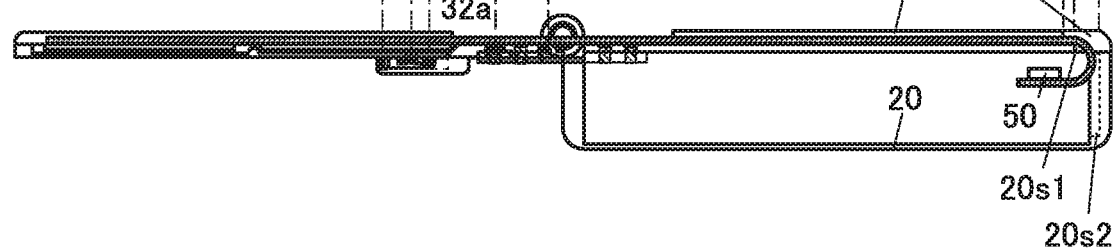

Then, details of the electronic device 10 are described in FIG. 6. Note that description is made on a top view of the electronic device 10 in FIG. 6(A), a development view of the movable module 30 in FIG. 6(B), and a cross-sectional view of the electronic device 10 in FIG. 6(C). Note that the description of components denoted by the same reference numerals in FIG. 6 to FIG. 9 is omitted.

First, the top view of the electronic device 10 is described with reference to FIG. 6(A). FIG. 6(A) is the top view of the electronic device 10 illustrated in FIG. 2(A). The component 20, the component 20a, the component 21a, the component 21b, the component 22, and the component 23 can each be fixed with a plurality of fixing units 40. For example, a screw or the like is used as the fixing unit 40, in which case two or more components can be easily fixed. Note that a plurality of components may be formed as one component. Effects such as simplification of assembly process and a reduction in the number of components can be obtained.

The movable portion 26 is constituted by the component 25, the component 25a, and the component 25b, the component 25a is fixed to the component 20, and the component 25b is fixed to the component 22. Note that the movable portion 26 is preferably arranged outside both ends of the movable module 30; alternatively, the movable module 30 may be arranged outside both ends of the movable portion 26.

The component 23, the component 21a, and the component 21b function as bezels. Note that in the case where the display panel 11 has flexibility, the display panel 11 can be prevented from slipping off from the bezels when having a region where the component 22, the component 24, the display region 11b of the display panel 11, and the component 23 are overlapped in this order and when the display region 11b is fixed to the component 24.

Figure 1B:
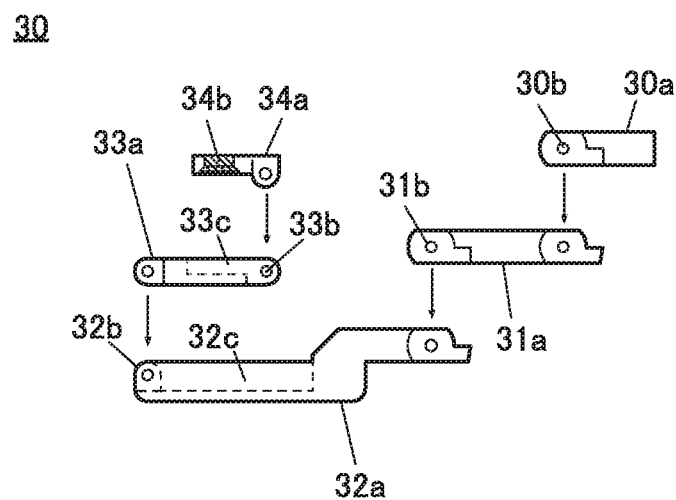

Since FIG. 6(B) has the same structure as the movable module 30 illustrated in FIG. 1(B), detailed description thereof is omitted. Note that the component 34a only needs to be connected to part of the component 33a; as an example, the component 34a is fixed to the component 33a in two regions in FIG. 6(A). Note that the movable portion 30b, the movable portion 31b, the movable portion 32b, and the movable portion 33b are preferably connected with a hinge or the like. For example, the movable portion 30b is fixed to the component 30a and the component 31a in two regions. The movable portion 31b is fixed to the component 31a and the component 32a in two regions. The movable portion 32b is fixed to the component 32a and the component 33a in two regions. The movable portion 33b is fixed to the component 33a and the component 34a in two regions.

For FIG. 6(C), the description of the electronic device 10 illustrated in FIG. 2(A) can be referred to. The component 20a includes the opening 20s1 so that the region 11d is stored in the fifth space formed by the component 20 and the component 20a. The component 21b is preferably in contact with the display panel 11, the component 21a, and the component 20.

FIG. 7(A) illustrates an electronic device 10A, which is different from the electronic device in FIG. 6(A). In FIG. 7(A), the component 21 is formed as one component. A reduction in the number of components can reduce the number of fixing units 40 and the number of assembly steps. Note that the component 20a includes the opening 20s1 so that the region 11d is stored in the fifth space formed by the component 20 and the component 20a. The component 21 is preferably in contact with the display panel 11 and the component 20a.

FIG. 7(C) includes the opening 20s1 with a width through which the electronic component 50 can pass. Note that the component 21 is preferably arranged at a position overlapping with the opening 20s1.

FIG. 8(A) illustrates an electronic device 10B, which is different from the electronic device in FIG. 7(A). In FIG. 8(A), the component 20a includes an opening 20s3 so that the region 11d is stored in the fifth space formed by the component 20 and the component 20a. The component 21 is preferably in contact with the display panel 11 and the component 20a. Note that in FIG. 8, the component 21 is shown as a transmissive component.

The opening 20s3 preferably has a first width through which a thickness S3 of the display portion of the display panel 11 passes and a second width S4 through which the thickness of the electronic component 50 passes. Note that a plurality of second widths can be provided. When the opening 20s3 has the first width S3 and the second width S4, the display panel 11 can be supported by a large area of the component 20a. In addition, the second width S4 can facilitate the assembly of the electronic device 10B even after the electronic component 50 is mounted on the display panel 11.

FIG. 9(A) illustrates an electronic device 10C, which is different from the electronic device in FIG. 7(A). In FIG. 9(A), the component 20a includes an opening 20s4. FIG. 9(C) illustrates details of the opening 20s4.

In the electronic device 10C, an electronic component 52 mounted on the region 11d is arranged in the opening 20s4. Note that the display panel 11 is electrically connected to an electronic component 53 through the electronic component 52. For example, a connector or the like can be used as the electronic component 52 or the electronic component 53. Since the display panel 11 is electrically connected to the electronic component 53 through the electronic component 52, the region 11d does not need to have a curved surface. When the curved surface is not included, the control of the radius of curvature can be omitted. In addition, the adhesion between the display panel 11 and the component 21 can be improved. Furthermore, the assembly of the electronic device 11C can be facilitated.

A foldable electronic device with a novel structure can be provided with use of FIG. 1 to FIG. 9. In the electronic device, the radius of curvature of a flexible display panel can be controlled. As a method for controlling the radius of curvature of the display panel, the display panel partly slides by using the movable module 30 and the component 24, so that the display panel can move a distance that is the same as the position shift generated when the display panel has a curved surface. It is thus possible to prevent the display panel from being broken by stress applied on the curved surface of the display panel. It is also possible to provide an electronic device including a flexible display panel that is prevented from slipping off from the electronic device.

The structures and methods described in this embodiment can be used in appropriate combination with the structures and methods described in the other embodiments.

Embodiment 2

In this embodiment, an example of the display panel illustrated in the above embodiment will be described.
[Structure Example]

Figure 10A:
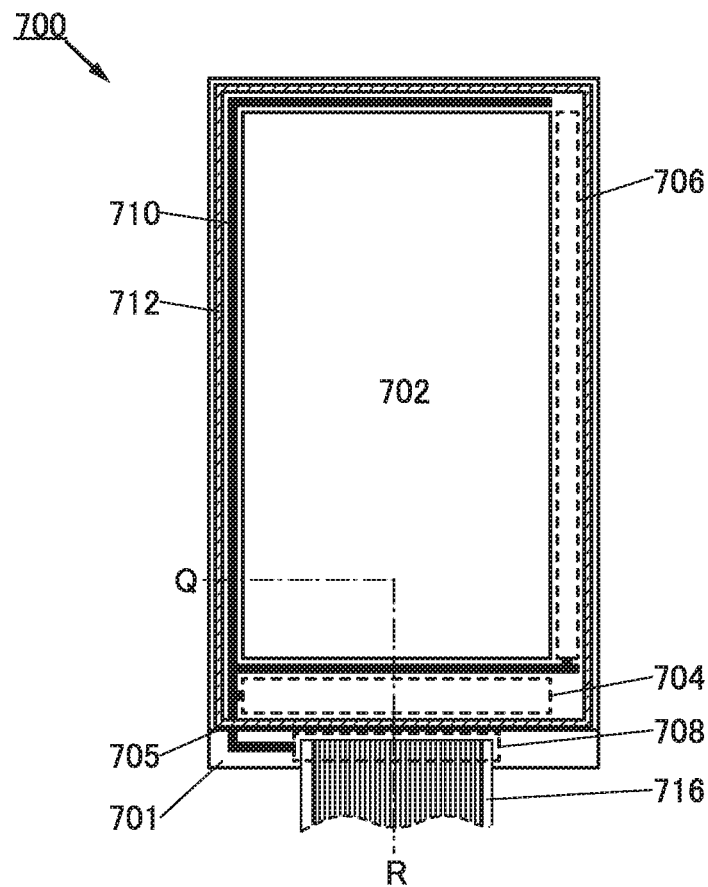
FIGS. 10(A) and 10(B) are a top view and a development view of a display device.

FIG. 10(A) shows a top view of a display panel 700. The display panel 700 includes a first substrate 701 and a second substrate 705 that are attached to each other with a sealant 712. In addition, over the first substrate 701, a pixel portion 702, a source driver 704, and a gate driver 706 are provided in a region sealed with the first substrate 701, the second substrate 705, and the sealant 712. Furthermore, a plurality of display elements are provided in the pixel portion 702.

A portion of the first substrate 701 that does not overlap with the second substrate 705 is provided with a terminal portion 708 to which an FPC 716 (FPC: Flexible printed circuit) is connected. The FPC 716 supplies a variety of signals and the like to the pixel portion 702, the source driver 704, and the gate driver 706 through the terminal portion 708 and a signal line 710.

A plurality of gate drivers 706 may be provided. In addition, each of the gate driver 706 and the source driver 704 may be formed separately over a semiconductor substrate or the like and may be in the form of a packaged IC chip. The IC chip can be mounted over the first substrate 701 or on the FPC 716. Note that the IC chip can be mounted on a surface (back surface) different from a display surface of the pixel portion 702 on which display data is displayed.

The pixel portion 702, the source driver 704, and the gate driver 706 can include transistors.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. Examples of the light-emitting element include self-luminous elements such as a micro LED (Light Emitting Diode), an OLED (Organic LED), a QLED (Quantum-dot LED), and a semiconductor laser. Moreover, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can also be used, for example.

Figure 10B:
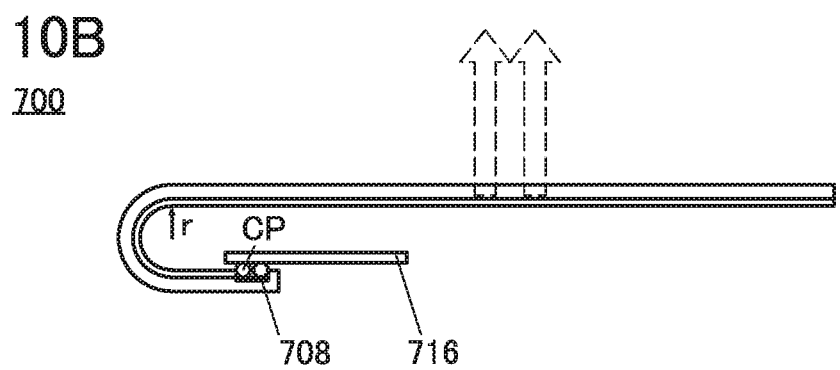

FIG. 10(B) shows a connection between the FPC 716 and the terminal portion 708 included in the display panel 700 shown in FIG. 10(A). In FIG. 10(B), with use of a through electrode, the terminal portion 708 can be exposed on the back surface direction of the pixel portion 702 on which display data is displayed. The terminal portion 708 and the FPC 716 are connected with an anisotropic conductive film containing a conductive particle CP with a diameter of approximately 3 μm. A driver IC, a connector, or the like may be connected to the terminal portion 708.
[Cross-Sectional Structure Example]

Figure 11:
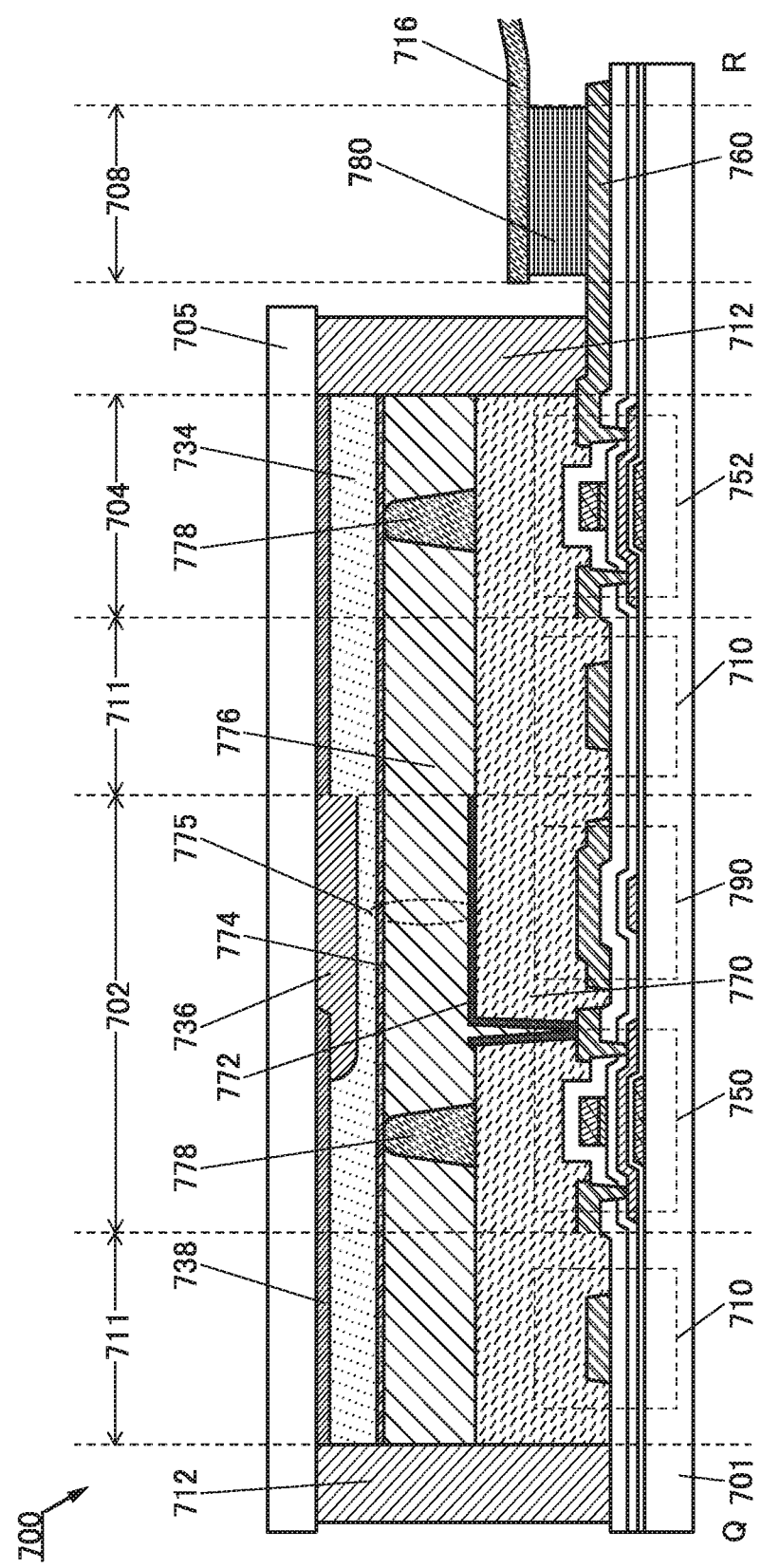
FIG. 11 is a cross-sectional view of a display panel.
Figure 12:
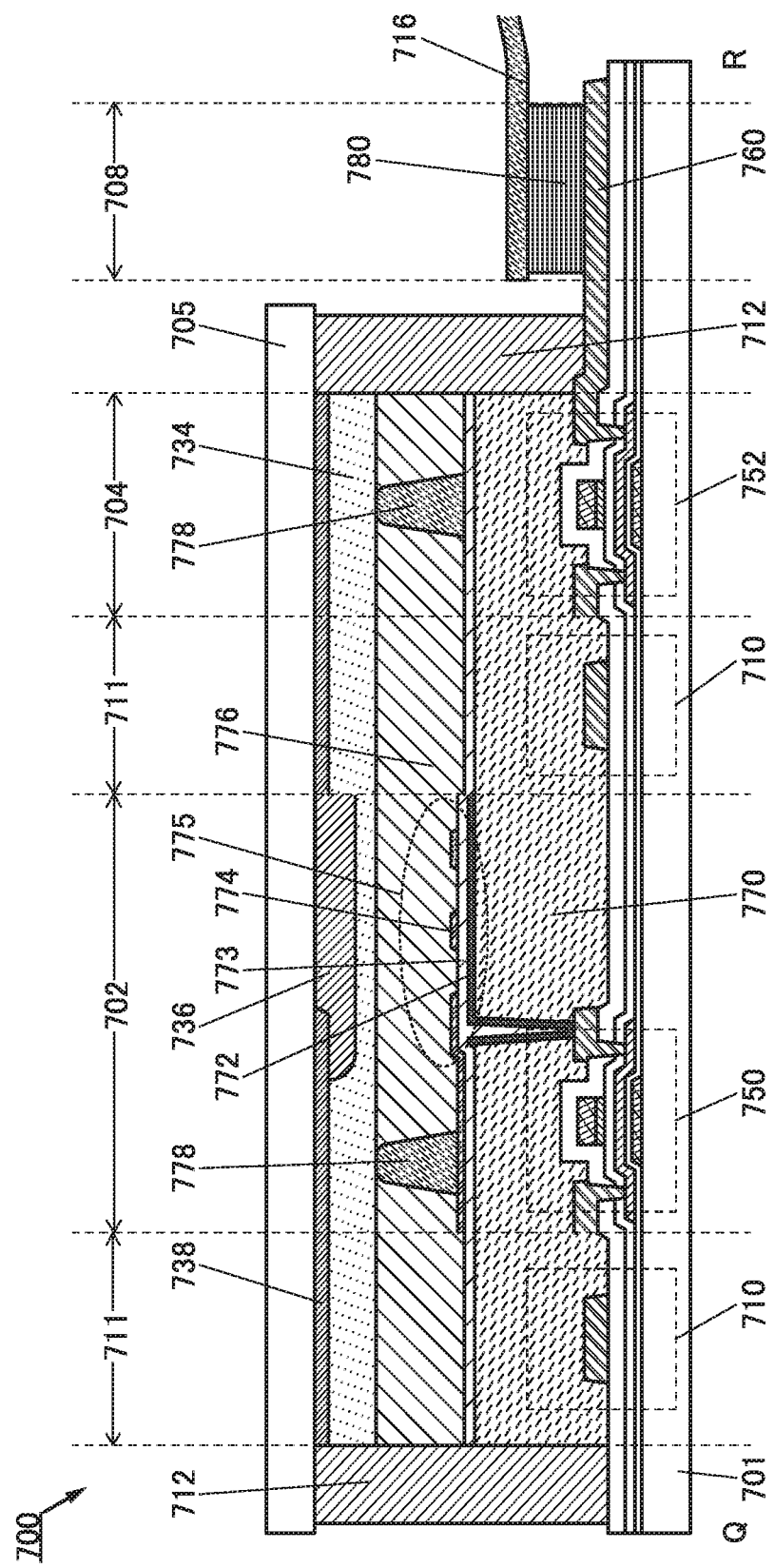
FIG. 12 is a cross-sectional view of a display panel.
Figure 13:
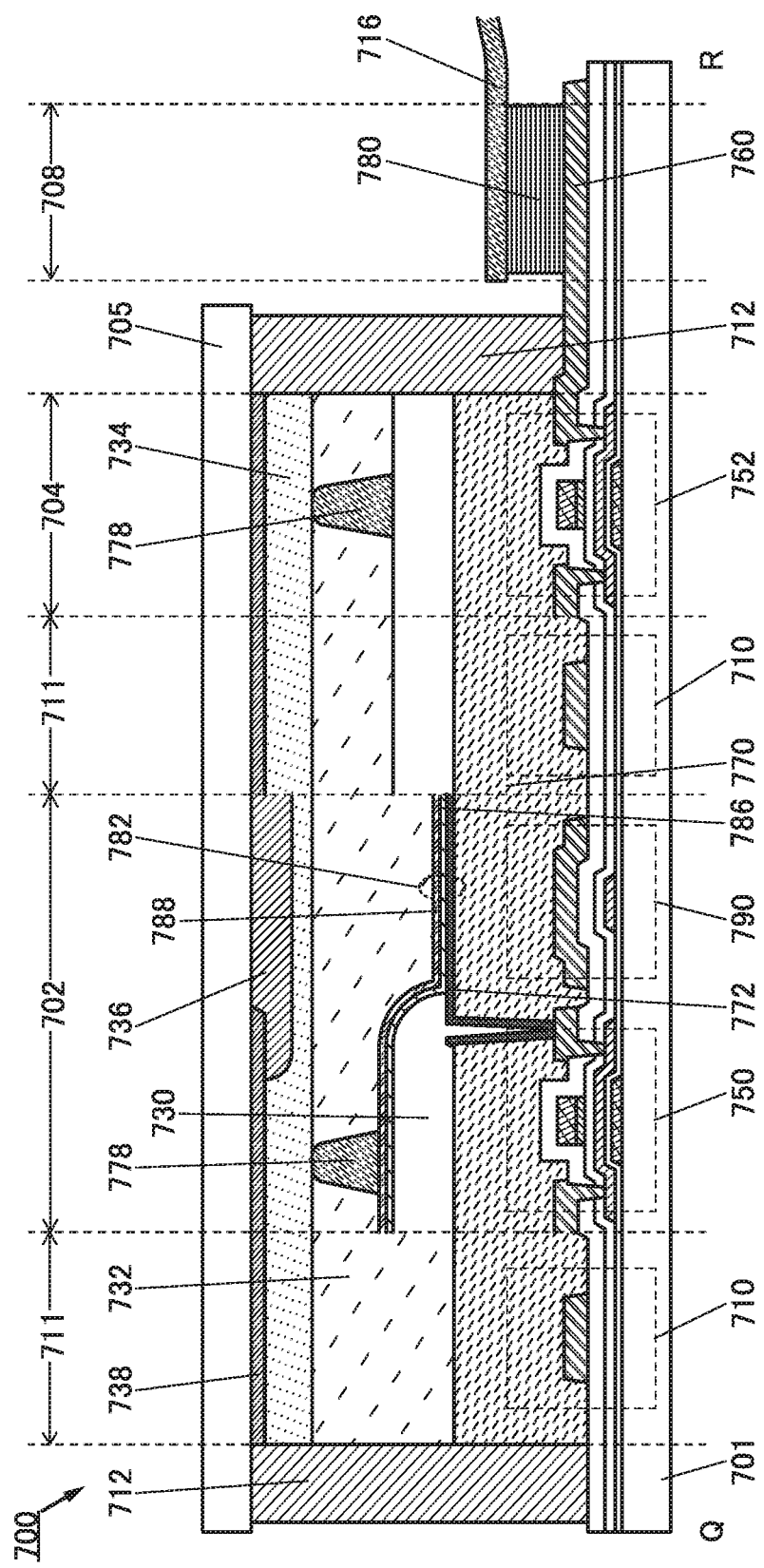
FIG. 13 is a cross-sectional view of a display panel.

Structures using a liquid crystal element or an EL element as a display element are described below with reference to FIG. 11 to FIG. 13. Note that FIG. 11 to FIG. 13 are each a cross-sectional view taken along the dashed-dotted line Q—R in FIG. 10(A). FIG. 11 and FIG. 12 each illustrate a structure using a liquid crystal element as a display element, and FIG. 13 illustrates a structure using an EL element.
[Description on Common Portions in Display Panels]

The display panel 700 shown in FIG. 11 to FIG. 13 includes a lead wiring portion 711, the pixel portion 702, the source driver 704, and the terminal portion 708. The lead wiring portion 711 includes the signal line 710. The pixel portion 702 includes a transistor 750 and a capacitor 790. The source driver 704 includes a transistor 752. FIG. 12 illustrates the case where the capacitor 790 is not provided.

As an example, the transistor 750 and the transistor 752 each include a metal oxide in a semiconductor layer that is highly purified and in which formation of oxygen vacancies is inhibited. The transistors can each have a low off-state current. Accordingly, an electrical signal such as an image signal can be held for a longer time, and the interval between writings can also be set longer in a power on state. Therefore, the frequency of refresh operations can be reduced, producing an effect of reducing power consumption. Hereinafter, a transistor including a metal oxide in a semiconductor layer is referred to as an OS transistor.

The transistors used in this embodiment can have comparatively high field-effect mobility and thus are capable of high-speed operation. For example, when such transistors capable of high-speed operation are used in a display panel, a switching transistor in a pixel portion and a driver transistor used in a driver circuit portion can be formed over one substrate.

That is, a semiconductor device formed with a silicon wafer or the like is not additionally needed as a driver circuit; thus, the number of components of the semiconductor device can be reduced. Moreover, when the transistors capable of high-speed operation are used also in the pixel portion, a high-quality image can be provided.

Note that transistors with a variety of modes can be used as the transistors. Thus, there is no limitation on the type of transistors used. For example, it is possible to use a thin film transistor (TFT) including a non-single-crystal semiconductor film typified by amorphous silicon, polycrystalline silicon, microcrystalline (also referred to as microcrystal or semi-amorphous) silicon, or the like. The use of the TFT has various advantages. For example, since the TFT can be manufactured at a temperature lower than that of the case of using single crystal silicon, manufacturing costs can be reduced or a larger manufacturing apparatus can be used. Since a larger manufacturing apparatus can be used, TFTs can be manufactured over a large substrate. This enables a large number of display panels to be manufactured at a time, reducing the manufacturing costs. In addition, a low manufacturing temperature allows the use of a low heat-resistance substrate. Thus, transistors can manufactured over a transparent substrate (a light-transmitting substrate). The transmission of light in a display element can be controlled by the transistors over the substrate. Alternatively, part of films of the transistors can transmit light because of their thin thicknesses. Accordingly, the aperture ratio can be improved.

Note that when a catalyst (e.g., nickel) is used in the formation of polycrystalline silicon, crystallinity can be further improved and a transistor having excellent electrical characteristics can be formed. As a result, a gate driver circuit (a scan line driver circuit), a source driver circuit (a signal line driver circuit), and a signal processing circuit (e.g., a signal generation circuit, a gamma correction circuit, or a DA converter circuit) can be integrally formed over a substrate.

Note that when a catalyst (e.g., nickel) is used in the formation of microcrystalline silicon, crystallinity can be further improved and a transistor having excellent electrical characteristics can be formed. In that case, crystallinity can be improved by just performing heat treatment without performing laser irradiation. As a result, a gate driver circuit (a scan line driver circuit) and part of a source driver circuit (e.g., an analog switch) can be integrally formed over a substrate. Note that when laser irradiation for crystallization is not performed, unevenness in crystallinity of silicon can be reduced. Therefore, images with improved quality can be displayed.

Note that it is possible to form polycrystalline silicon or microcrystalline silicon without a catalyst (e.g., nickel).

Note that although the crystallinity of silicon is preferably improved to polycrystal, microcrystal, or the like in the whole panel, the present invention is not limited to this. The crystallinity of silicon may be improved only in a partial region of the panel. Selective increase in crystallinity can be achieved by selective laser light irradiation or the like. For example, only a peripheral circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, the crystallinity of silicon can be improved only in a region in which a circuit needs to operate at high speed. Because a pixel region is not particularly needed to operate at high speed, the pixel circuit can operate without any problem even if the crystallinity is not improved. Since the crystallinity only needs to be improved in a small region, manufacturing steps can be decreased, throughput can be increased, and manufacturing costs can be reduced. In addition, the number of necessary manufacturing apparatuses is reduced, resulting in lower manufacturing costs.

The capacitor 790 shown in FIG. 11 and FIG. 13 includes a lower electrode formed by processing the same film as that for the semiconductor layer of the transistor 750 and reducing the resistance, and an upper electrode formed by processing the same conductive film as that for a source electrode or a drain electrode. Furthermore, two insulating films covering the transistor 750 are provided between the lower electrode and the upper electrode. That is, the capacitor 790 has a stacked-layer structure in which the insulating films functioning as dielectric films are interposed between a pair of electrodes.

A planarization insulating film 770 is provided over the transistor 750, the transistor 752, and the capacitor 790.

As the transistor 750 included in the pixel portion 702 and the transistor 752 included in the source driver 704, transistors having different structures may be used. For example, a top-gate transistor may be used as one of the transistors and a bottom-gate transistor may be used as the other. Note that the source driver 704 described above may be replaced with a gate driver circuit portion.

The signal line 710 is formed using the same conductive film as that for the source electrodes and the drain electrodes of the transistors 750 and 752, and the like. Here, a low-resistance material such as a material containing a copper element is preferably used, in which case signal delay or the like due to wiring resistance can be reduced and display on a large screen is possible.

The terminal portion 708 includes a connection electrode 760, an anisotropic conductive film 780, and the FPC 716. The connection electrode 760 is electrically connected to a terminal of the FPC 716 through the anisotropic conductive film 780. Here, the connection electrode 760 is formed using the same conductive film as that for the source electrodes and the drain electrodes of the transistors 750 and 752, and the like.

As the first substrate 701 and the second substrate 705, a glass substrate or a flexible substrate such as a plastic substrate can be used, for example.

On the second substrate 705 side, a light-blocking film 738, a coloring film 736, and an insulating film 734 that is in contact with these films are provided.

[Structure Example of Display Panel Using Liquid Crystal Element]

The display panel 700 shown in FIG. 11 includes a liquid crystal element 775. The liquid crystal element 775 includes a conductive layer 772, a conductive layer 774, and a liquid crystal layer 776 provided therebetween. The conductive layer 774 is provided on the second substrate 705 side and has a function of a common electrode. In addition, the conductive layer 772 is electrically connected to the source electrode or the drain electrode of the transistor 750. The conductive layer 772 is formed over the planarization insulating film 770 and functions as a pixel electrode.

For the conductive layer 772, a material having a visible-light-transmitting property or a material having a visible-light-reflecting property can be used. An oxide material containing indium, zinc, tin, or the like is preferably used as the light-transmitting material, for example. A material containing aluminum, silver, or the like is preferably used as the reflective material, for example.

When a reflective material is used for the conductive layer 772, the display panel 700 is a reflective liquid crystal display panel. On the other hand, when a light-transmitting material is used for the conductive layer 772, the display panel 700 is a transmissive liquid crystal display panel. In the case of a reflective liquid crystal display panel, a polarizing plate is provided on the viewer side. On the other hand, in the case of a transmissive liquid crystal display panel, a pair of polarizing plates are provided such that the liquid crystal element is sandwiched therebetween.

The display panel 700 shown in FIG. 12 is an example of using the liquid crystal element 775 in a horizontal electric field mode (e.g., an FFS mode). The conductive layer 774 functioning as a common electrode is provided over the conductive layer 772 with an insulating layer 773 therebetween. The alignment state of the liquid crystal layer 776 can be controlled by an electric field generated between the conductive layer 772 and the conductive layer 774.

In FIG. 12, a storage capacitor can be composed of a stacked-layer structure of the conductive layer 774, the insulating layer 773, and the conductive layer 772. Therefore, it is not necessary to provide a capacitor separately, increasing the aperture ratio.

Although not shown in FIG. 11 and FIG. 12, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

For the liquid crystal layer 776, thermotropic liquid crystal, low-molecular liquid crystal, high-molecular liquid crystal, polymer dispersed liquid crystal, polymer network liquid crystal, ferroelectric liquid crystal, anti-ferroelectric liquid crystal, or the like can be used. In the case of employing a horizontal electric field mode, liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like can be used.

[Display Panel Using Light-Emitting Element]

The display panel 700 shown in FIG. 13 includes a light-emitting element 782. The light-emitting element 782 includes the conductive layer 772, an EL layer 786, and a conductive film 788. The EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material.

In the display panel 700 shown in FIG. 13, an insulating film 730 covering part of the conductive layer 772 is provided over the planarization insulating film 770. Here, the light-emitting element 782 is a top-emission light-emitting element including the light-transmitting conductive film 788. Note that the light-emitting element 782 may have a bottom-emission structure in which light is emitted to the conductive layer 772 side or a dual-emission structure in which light is emitted to both the conductive layer 772 and the conductive film 788.

The coloring film 736 is provided in a position overlapping with the light-emitting element 782, and the light-blocking film 738 is provided in a position overlapping with the insulating film 730 and in the lead wiring portion 711 and the source driver 704. The coloring film 736 and the light-blocking film 738 are covered with the insulating film 734. A space between the light-emitting element 782 and the insulating film 734 is filled with a sealing film 732. Note that a structure without the coloring film 736 may also be employed in the case where the EL layer 786 is formed into an island shape for each pixel or a stripe shape for each pixel column, i.e., formed by separate coloring.

[Structure Example of Display Panel Provided with Input Device]

An input device may be provided in the display panel 700 shown in FIG. 11 to FIG. 13. Examples of the input device include a touch sensor.

For example, a variety of types such as a capacitive type, a resistive type, a surface acoustic wave type, an infrared type, an optical type, and a pressure-sensitive type can be used for the sensor. Alternatively, a combination of two or more of these types may be employed.

Note that examples of a touch panel structure include a so-called in-cell touch panel in which an input device is formed inside a pair of substrates, a so-called on-cell touch panel in which an input device is formed over the display panel 700, and a so-called out-cell touch panel in which an input device is attached to the display panel 700.

At least part of the structure examples, the drawings corresponding thereto, and the like illustrated in this embodiment can be implemented in appropriate combination with the other structure examples, the other drawings, and the like.

At least part of this embodiment can be implemented in appropriate combination with the other embodiments described in this specification.

Embodiment 3

In this embodiment, a display panel will be described with reference to FIG. 14.

Figure 14A:
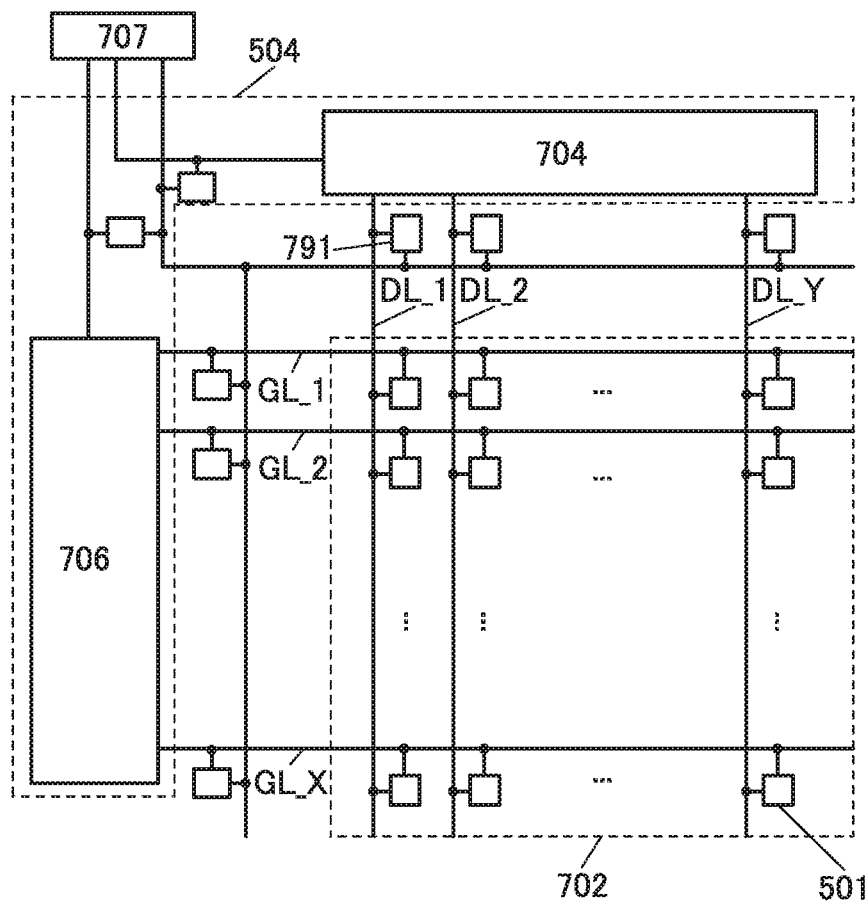
FIGS. 14(A) to 14(C) are a block diagram and circuit diagrams of a display panel.

The display panel shown in FIG. 14(A) includes a pixel portion 702, a driver circuit portion 504, protection circuits 791, and a terminal portion 707. Note that a structure in which the protection circuits 791 are not provided may be employed.

An OS transistor can be used as transistors included in the pixel portion 702 and the driver circuit portion 504. An OS transistor can also be used in the protection circuits 791.

The pixel portion 702 includes a plurality of pixel circuits 501 that drive a plurality of display elements arranged in X rows and Y columns (X and Y each independently represent a natural number of 2 or more).

The driver circuit portion 504 includes driver circuits such as a gate driver 706 that outputs a scan signal to gate lines GL_1 to GL_X and a source driver 704 that supplies a data signal to data lines DL_1 to DL_Y. The gate driver 706 includes at least a shift register. The source driver 704 is formed using a plurality of analog switches, for example. Alternatively, the source driver 704 may be formed using a shift register or the like.

The terminal portion 707 refers to a portion provided with terminals for inputting power, control signals, image signals, and the like to the display panel from external circuits.

The protection circuit 791 is a circuit that makes, when a potential out of a certain range is supplied to a wiring connected to the protection circuit 791, the wiring and another wiring be in a conduction state. The protection circuit 791 shown in FIG. 14(A) is connected to, for example, a variety of wirings such as scan lines GL, which are wirings between the gate driver 706 and the pixel circuits 501, and data lines DL, which are wirings between the source driver 704 and the pixel circuits 501.

The gate driver 706 and the source driver 704 may be provided over the same substrate as the pixel portion 702, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 14B:
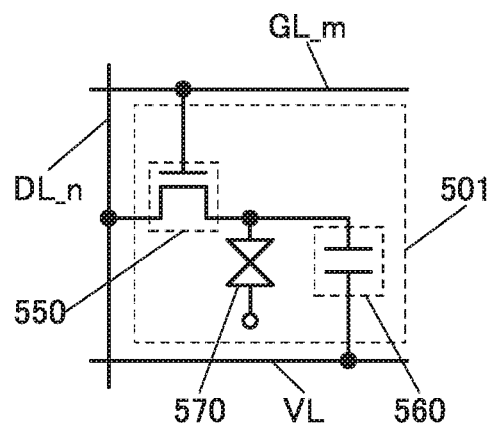
Figure 14C:
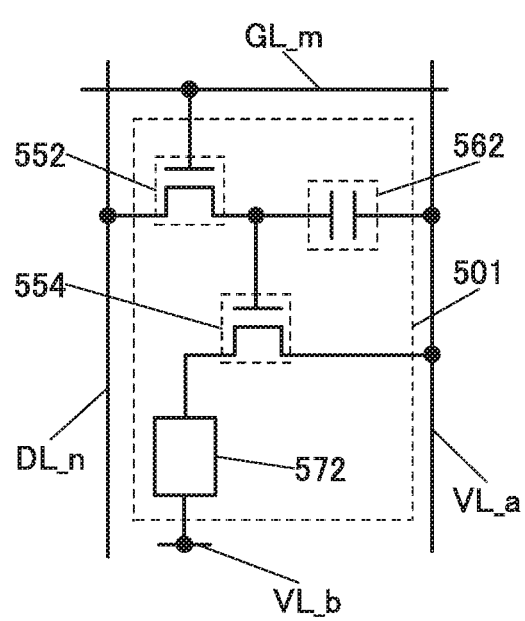

The plurality of pixel circuits 501 shown in FIG. 14(A) can have a configuration shown in FIG. 14(B) or 14(C), for example.

The pixel circuit 501 shown in FIG. 14(B) includes a liquid crystal element 570, a transistor 550, and a capacitor 560. In addition, a data line DL_n, a scan line GL_m, a potential supply line VL, and the like are connected to the pixel circuit 501.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 in the pixel circuit 501 may differ between rows.

The pixel circuit 501 shown in FIG. 14(C) includes transistors 552 and 554, a capacitor 562, and a light-emitting element 572. In addition, the data line DL_n, the scan line GL_m, a potential supply line VL_a, a potential supply line VL_b, and the like are connected to the pixel circuit 501.

Note that a high power supply potential $V_{DD}$ is supplied to one of the potential supply line VL_a and the potential supply line VL_b, and a low power supply potential $V_{SS}$ is supplied to the other. Current flowing through the light-emitting element 572 is controlled in accordance with the potential supplied to a gate of the transistor 554, so that the luminance of light emitted from the light-emitting element 572 is controlled.

At least part of the structure examples, the drawings corresponding thereto, and the like illustrated in this embodiment can be implemented in appropriate combination with the other structure examples, the other drawings, and the like.

At least part of this embodiment can be implemented in appropriate combination with the other embodiments described in this specification.

Embodiment 4

A pixel circuit including a memory for correcting gray levels displayed by pixels and a display panel including the pixel circuit will be described below.

[Circuit Configuration]

Figure 15A:
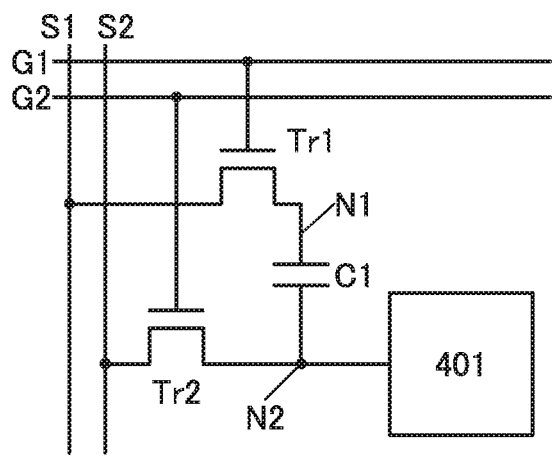
FIGS. 15(A) to 15(D) are circuit diagrams and a timing chart of a display panel.

FIG. 15(A) shows a circuit diagram of a pixel circuit 400. The pixel circuit 400 includes a transistor Tr1, a transistor Tr2, a capacitor C1, and a circuit 401. In addition, a wiring S1, a wiring S2, a wiring G1, and a wiring G2 are connected to the pixel circuit 400.

In the transistor Tr1, a gate is connected to the wiring G1, one of a source and a drain is connected to the wiring S1, and the other is connected to one electrode of the capacitor C1. In the transistor Tr2, a gate is connected to the wiring G2, one of a source and a drain is connected to the wiring S2, and the other is connected to the other electrode of the capacitor C1 and the circuit 401.

The circuit 401 is a circuit including at least one display element. A variety of elements can be used as the display element, and typically, a light-emitting element such as an organic EL element or an LED element, a liquid crystal element, a MEMS (Micro Electro Mechanical Systems) element, or the like can be employed.

A node connecting the transistor Tr1 and the capacitor C1 is denoted as N1, and a node connecting the transistor Tr2 and the circuit 401 is denoted as N2.

In the pixel circuit 400, the potential of the node N1 can be retained when the transistor Tr1 is turned off. The potential of the node N2 can be retained when the transistor Tr2 is turned off. When a predetermined potential is written to the node N1 through the transistor Tr1 with the transistor Tr2 being in an off state, the potential of the node N2 can be changed in accordance with displacement of the potential of the node N1 owing to capacitive coupling through the capacitor C1.

Here, an OS transistor can be used as one or both of the transistor Tr1 and the transistor Tr2. Accordingly, the potentials of the node N1 and the node N2 can be retained for a long time owing to an extremely low off-state current. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 15B:
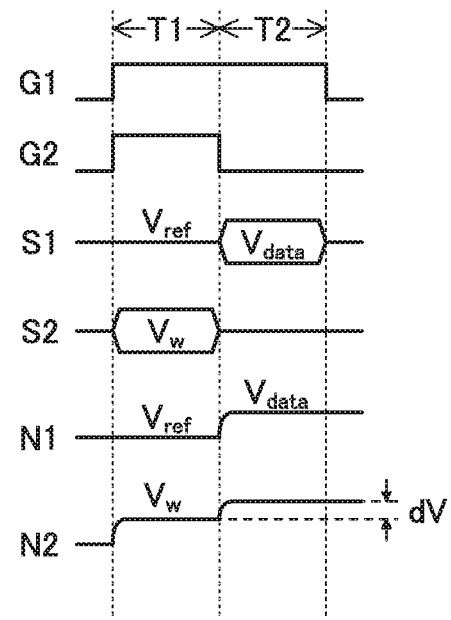

Next, an example of a method for operating the pixel circuit 400 is described with reference to FIG. 15(B). FIG. 15(B) is a timing chart of the operation of the pixel circuit 400. Note that here, for simplification of description, the influence of a variety of resistance such as wiring resistance, the parasitic capacitance of a transistor, a wiring, and the like, the threshold voltage of a transistor, and the like is not taken into consideration.

In the operation shown in FIG. 15(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor Tr1. The first data potential $V_w$ is supplied to the node N2 through the transistor Tr2. Accordingly, a potential difference $V_w - V_{ref}$ is retained in the capacitor C1.

[Period T2]

Next, in the period T2, a potential for turning on the transistor Tr1 is supplied to the wiring G1, and a potential for turning off the transistor Tr2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor Tr1. At this time, capacitive coupling due to the capacitor C1 changes the potential of the node N2 by a potential dV in accordance with the second data potential $V_{data}$. That is, a potential that is the sum of the first data potential $V_w$ and the potential dV is input to the circuit 401. Note that although the potential dV is shown as having a positive value in FIG. 15(B), it may have a negative value. In other words, the potential $V_{data}$ may be lower than the potential $V_{ref}$.

Here, the potential dV is roughly determined by the capacitance of the capacitor C1 and the capacitance of the circuit 401. In the case where the capacitance of the capacitor C1 is sufficiently higher than the capacitance of the circuit 401, the potential dV is a potential close to the second data potential $V_{data}$.

As described above, a potential to be supplied to the circuit 401 including the display element can be generated by a combination of two kinds of data signals in the pixel circuit 400, so that gray levels can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

[Application Examples]

[Example Using Liquid Crystal Element]

Figure 15C:
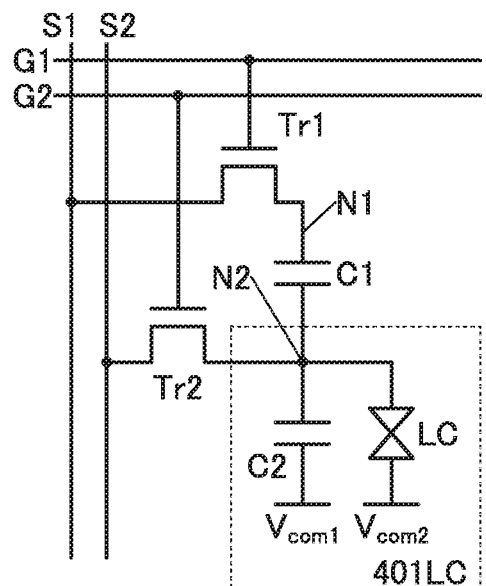

A pixel circuit 400LC shown in FIG. 15(C) includes a circuit 401LC. The circuit 401LC includes a liquid crystal element LC and a capacitor C2.

One electrode of the liquid crystal element LC is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high drive voltage can be employed, for example. In addition, gray levels can also be corrected in accordance with the operating temperature, the degradation state of the liquid crystal element LC, or the like by supply of a correction signal to the wiring S1 or the wiring S2.

[Example Using Light-Emitting Element]

Figure 15D:
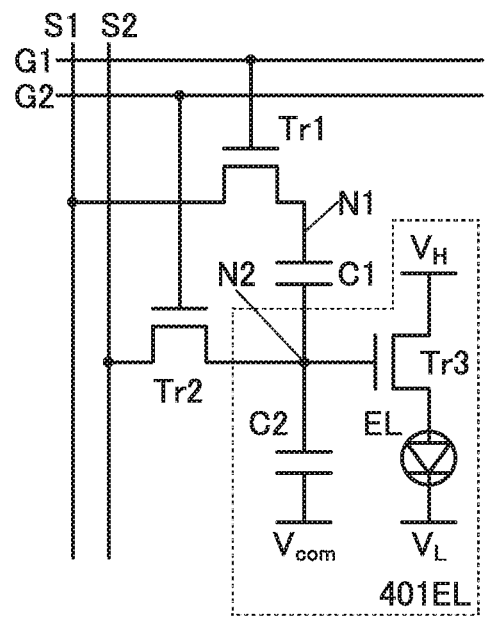

A pixel circuit 400EL shown in FIG. 15(D) includes a circuit 401EL. The circuit 401EL includes a light-emitting element EL, a transistor Tr3, and the capacitor C2.

In the transistor Tr3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor Tr3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor Tr3 is described here, the transistor Tr3 may be connected to the cathode side. In that case, the values of the potential $V_H$ and the potential $V_L$ can be changed as appropriate.

In the pixel circuit 400EL, a large amount of current can flow through the light-emitting element EL when a high potential is supplied to the gate of the transistor Tr3, which enables HDR display or the like, for example. In addition, a variation in the electrical characteristics of the transistor Tr3 and the light-emitting element EL can also be corrected by supply of a correction signal to the wiring S1 or the wiring S2.

Note that without limitation to the circuits illustrated in FIGS. 15(C) and 15(D), a configuration to which a transistor, a capacitor, or the like is further added may be employed.

At least part of this embodiment can be implemented in appropriate combination with the other embodiments described in this specification.

Embodiment 5

In this embodiment, an electronic device of one embodiment of the present invention will be described with reference to drawings.

Figure 16:
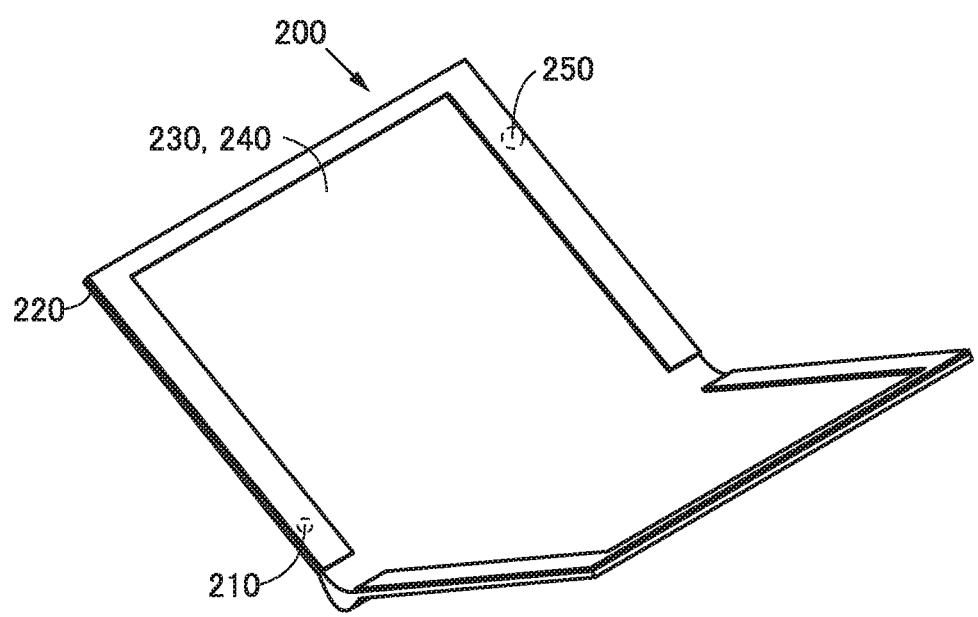
FIG. 16 is a diagram illustrating an electronic device.

An electronic device illustrated in FIG. 16 includes a housing and a display panel of one embodiment of the present invention in a display portion. Since the housing can be folded, a small, flexible electronic device provided with a large display region is achieved.

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

An electronic device 200 functions as an input/output device 220. A sensor 210 and the input/output device 220 include a display portion 230, an input portion 240, and a sensing portion 250. The sensing portion 250 preferably includes an optical sensor. When the electronic device holds the first state, no display can be performed on the display portion 230 with use of a value sensed by the optical sensor. It is possible to reduce the power consumption in a period during which the electronic device is not used by a user. Note that the sensor 210 preferably includes one or more of a position sensor for sensing position information, a camera, a temperature sensor, a fingerprint sensor, and the like.

At least part of this embodiment can be implemented in appropriate combination with the other embodiments described in this specification.

Embodiment 6

Described in this embodiment is the composition of a CAC (Cloud-Aligned Composite)-OS applicable to the OS transistor described in the above embodiments.

The CAC-OS has, for example, a composition in which elements included in a metal oxide are unevenly distributed.

Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is difficult to clearly observe in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is an X-ray diffraction (XRD) measurement method. That is, it is found from the X-ray diffraction measurement that no alignment in the a-b plane direction and the c-axis direction is observed in the measured region.

In an electron diffraction pattern of the CAC-OS that is obtained by irradiation with an electron beam with a probe diameter of 1 nm (also referred to as a nanometer-sized electron beam), a ring-like region with high luminance (a ring region) and a plurality of bright spots in the ring region are observed. Therefore, the electron diffraction pattern indicates that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other and form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

This embodiment can be implemented in appropriate combination with any of the other embodiments.

Unless otherwise specified, an on-state current in this specification refers to a drain current of a transistor in an on state. Unless otherwise specified, the on state (sometimes abbreviated as on) refers to a state where the voltage between its gate and source ($V_G$) is higher than or equal to the threshold voltage ($V_{th}$) in an n-channel transistor, and a state where $V_G$ is lower than or equal to $V_{th}$ in a p-channel transistor. For example, the on-state current of an n-channel transistor refers to a drain current when $V_G$ is higher than or equal to $V_{th}$. Furthermore, the on-state current of a transistor depends on a voltage between a drain and a source ($V_D$) in some cases.

Unless otherwise specified, an off-state current in this specification refers to a drain current of a transistor in an off state. Unless otherwise specified, the off state (sometimes abbreviated to as off) refers to a state where $V_G$ is lower than $V_{th}$ in an n-channel transistor, and a state where $V_G$ is higher than $V_{th}$ in a p-channel transistor. For example, the off-state current of an n-channel transistor refers to a drain current when $V_G$ is lower than $V_{th}$. The off-state current of a transistor depends on $V_G$ in some cases. Thus, "the off-state current of a transistor is lower than $10^{-21}$ A" may mean that there is $V_G$ at which the off-state current of the transistor is lower than $10^{-21}$ A.

Furthermore, the off-state current of a transistor depends on $V_D$ in some cases. Unless otherwise specified, the off-state current in this specification may refer to an off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may refer to an off-state current at $V_D$ used in a semiconductor device or the like including the transistor.

Note that a voltage refers to a potential difference between two points, and a potential refers to electrostatic energy (electric potential energy) of a unit charge at a given point in an electrostatic field. Note that in general, a potential difference between a potential of one point and a reference potential (e.g., a ground potential) is simply called a potential or a voltage, and a potential and a voltage are used as synonymous words in many cases. Therefore, in this specification, a potential may be rephrased as a voltage and a voltage may be rephrased as a potential unless otherwise specified.

In this specification and the like, when there is a description which explicitly states that X and Y are connected, the case where X and Y are electrically connected and the case where X and Y are directly connected are regarded as being disclosed in this specification and the like.

Here, X and Y each denote an object (e.g., a device, an element, a circuit, a wiring, an electrode, a terminal, a conductive film, or a layer).

An example of the case where X and Y are directly connected is the case where X and Y are connected without an element that enables electrical connection between X and Y (e.g., a switch, a transistor, a capacitor, an inductor, a resistor, a diode, a display element, a light-emitting element, or a load).

An example of the case where X and Y are electrically connected is the case where at least one element that enables electrical connection between X and Y (e.g., a switch, a transistor, a capacitor, an inductor, a resistor, a diode, a display element, a light-emitting element, or a load) can be connected between X and Y. Note that a switch has a function of controlling whether current flows or not by being in a conduction state (an on state) or a non-conduction state (an off state). Alternatively, the switch has a function of selecting and changing a current path. Note that the case where X and Y are electrically connected includes the case where X and Y are directly connected.

REFERENCE NUMERALS

C1: capacitor, C2: capacitor, G1: wiring, G2: wiring, S1: wiring, S2: wiring, Tr1: transistor, Tr2: transistor, Tr3: transistor, 10: electronic device, 10A: electronic device, 10B: electronic device, 10C: electronic device, 11: display panel, 11a: display region, 11b: display region, 11c: display region, 11C: electronic device, 20: component, 20a: component, 20s1: opening, 20s2: space, 20s3: opening, 20s4: opening, 21: component, 21a: component, 21b: component, 21s: space, 22: component, 22a: space, 22b: structure body, 23: component, 24: component, 25: component, 25a: component, 25b: component, 25c: component, 25d: component, 26: movable portion, 27: housing, 30: movable module, 30a: component, 30b: movable portion, 31a: component, 31b: movable portion, 32a: component, 32b: movable portion, 32c: space, 33a: component, 33b: movable portion, 33c: space, 34a: component, 34b: component, 40: fixing unit, 50: electronic component, 51: electronic component, 52: electronic component, 53: electronic component, 60: space, 200: electronic device, 210: sensor, 220: input/output device, 230: display portion, 240: input portion, 250: sensing portion, 400: pixel circuit, 400EL: pixel circuit, 400LC: pixel circuit, 401: circuit, 401EL: circuit, 401LC: circuit, 501: pixel circuit, 504: driver circuit portion, 550: transistor, 552: transistor, 554: transistor, 560: capacitor, 562: capacitor, 570: liquid crystal element, 572: light-emitting element, 700: display panel, 701: substrate, 702: pixel portion, 704: source driver, 705: substrate, 706: gate driver, 707: terminal portion, 708: terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive layer, 773: insulating layer, 774: conductive layer, 775: liquid crystal element, 776: liquid crystal layer, 780: anisotropic conductive film, 782: light-emitting element, 786: EL layer, 788: conductive film, 790: capacitor, 791: protection circuit

The invention claimed is:

1. An electronic device comprising a display panel, a first component, a movable module, and a housing,
   wherein the housing includes a first movable portion, a second component, and a third component,
   wherein the third component includes a first space where the first component is stored,
   wherein the display panel includes a flexible display portion, wherein the display portion includes a first region, a second region, and a third region, wherein the first region is fixed to the second component, wherein the second region is fixed to the first component stored in the first space, wherein the first movable portion connects the second component and the third component, wherein the movable module is configured to hold a first angle that is formed between the second component and the third component by the first movable portion, wherein the third region positioned between the first region and the second region is configured to form a curved surface according to the first angle, wherein the first component slides in the first space according to the first angle, wherein the movable module includes a fourth component, a fifth component, a sixth component, a seventh component, an eighth component, a second movable portion, a third movable portion, a fourth movable portion, and a fifth movable portion, wherein the fourth component is connected to the first movable portion and the fifth component, wherein the fifth component is connected to the sixth component, wherein the sixth component is connected to the seventh component, wherein the seventh component is connected to the eighth component, wherein the second movable portion controls a second angle formed by the fourth component and the fifth component, wherein the third movable portion controls a third angle formed by the fifth component and the sixth component, wherein the fourth movable portion controls a fourth angle formed by the sixth component and the seventh component, wherein the fifth movable portion controls a fifth angle formed by the seventh component and the eighth component, wherein the sixth component includes a second space where the seventh component is stored, wherein the seventh component includes a third space where the eighth component is stored, and wherein the eighth component is fixed to the third component and fixed to a surface of the third component that is different from a surface where the first space is provided.

2. The electronic device according to claim 1, wherein the third component includes a structure body with a shape that projects toward the first space, wherein the first component includes a notch region, wherein the notch region is arranged so that the structure body with a projecting shape is positioned in the notch region, and wherein a size of the notch region is a movable range of the first component that slides in the first space.

3. The electronic device according to claim 1, wherein the housing further includes a ninth component, wherein the display panel includes a fourth region where an electronic component is mounted, wherein the second component includes an opening so that the fourth region is stored in a fifth space formed by the second component and the ninth component, wherein the opening has a first width and a second width, and wherein the first width is greater than a thickness of the display portion and the second width is greater than a thickness of a portion where the electronic component is mounted.

4. The electronic device according to claim 1, wherein in the case where the seventh component is not stored in the second space in the sixth component and the eighth component is not stored in the third space in the seventh component, a fourth space is formed by the fifth component, the sixth component, and the seventh component and part of the display panel is positioned in the fourth space.

5. The electronic device according to claim 1, wherein in the case where the seventh component is stored in the second space in the sixth component and the eighth component is stored in the third space in the seventh component, the display panel is positioned parallel to part of each of the fourth component, the fifth component, and the sixth component or is in contact with part of each of the fourth component, the fifth component, and the sixth component.

6. The electronic device according to claim 1, wherein the display panel includes a transistor, and wherein the transistor includes polycrystalline silicon in a semiconductor layer.

7. The electronic device according to claim 1, wherein the display panel includes a transistor, and wherein the transistor includes a metal oxide in a semiconductor layer.

8. The electronic device according to claim 7, wherein the transistor includes a back gate.

* * * * *